United States Patent
Im et al.

(10) Patent No.: US 12,035,582 B2
(45) Date of Patent: Jul. 9, 2024

(54) DISPLAY DEVICE HAVING A LIGHT EMITTING ELEMENT BETWEEN A BRANCH WIRING AND A COMMON BRANCH WIRING

(71) Applicant: Samsung Display Co., Ltd., Yongin-si (KR)

(72) Inventors: Hyun Deok Im, Seoul (KR); Jong Hyuk Kang, Suwon-si (KR); Dae Hyun Kim, Hwaseong-si (KR); Jung Hong Min, Pyeongtaek-si (KR); Bek Hyun Lim, Hwaseong-si (KR); Hyun Min Cho, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 641 days.

(21) Appl. No.: 17/255,985

(22) PCT Filed: Sep. 20, 2018

(86) PCT No.: PCT/KR2018/011128
§ 371 (c)(1),
(2) Date: Dec. 23, 2020

(87) PCT Pub. No.: WO2020/004713
PCT Pub. Date: Jan. 2, 2020

(65) Prior Publication Data
US 2021/0225993 A1 Jul. 22, 2021

(30) Foreign Application Priority Data
Jun. 26, 2018 (KR) .................. 10-2018-0073551

(51) Int. Cl.
*H10K 59/131* (2023.01)
(52) U.S. Cl.
CPC ................. *H10K 59/131* (2023.02)

(58) Field of Classification Search
CPC ... H01L 33/62; H01L 25/167; H01L 25/0753; H10K 59/131; H10K 59/35; H10K 50/805; H10K 71/00; H10K 59/95
(Continued)

(56) References Cited

U.S. PATENT DOCUMENTS

| | | | |
|---|---|---|---|
| 7,253,438 B2* | 8/2007 | Sasabayashi | G02F 1/133711 |
| | | | 257/40 |
| 8,698,159 B2* | 4/2014 | Park | H01L 27/12 |
| | | | 257/59 |

(Continued)

FOREIGN PATENT DOCUMENTS

| CN | 101221959 A | 7/2008 |
|---|---|---|
| CN | 107610602 A | 1/2018 |

(Continued)

OTHER PUBLICATIONS

International Search Report issued in International Application No. PCT/KR2018/011128, dated Mar. 25, 2019, 3 pages.

(Continued)

*Primary Examiner* — Khiem D Nguyen
(74) *Attorney, Agent, or Firm* — Lewis Roca Rothgerber Christie LLP

(57) ABSTRACT

A display device includes: a first pixel stem wiring and a common stem wiring extending in a first direction and spaced apart from each other; a first pixel branch wiring branched from the first pixel stem wiring and extending in a second direction crossing the first direction; a common branch wiring branched from the common stem wiring and extending in the second direction; and a first light emitting element between the first pixel branch wiring and the common branch wiring. The first pixel branch wiring includes a base branch pattern connected to the first pixel stem wiring, a separate branch pattern spaced apart from the (Continued)

base branch pattern, and a bridge wiring connecting the base branch pattern to the separate branch pattern.

18 Claims, 26 Drawing Sheets

(58) Field of Classification Search
USPC .......................................................... 257/40
See application file for complete search history.

(56) References Cited

U.S. PATENT DOCUMENTS

| | | | | |
|---|---|---|---|---|
| 8,759,832 | B2* | 6/2014 | Yang | H01L 27/1251 |
| | | | | 438/149 |
| 9,773,761 | B2* | 9/2017 | Do | H05K 1/0295 |
| 2007/0139437 | A1 | 6/2007 | Boroson et al. | |
| 2008/0079859 | A1 | 4/2008 | Ota | |
| 2008/0128699 | A1 | 6/2008 | Seong et al. | |
| 2008/0230768 | A1* | 9/2008 | Goh | H01L 29/78621 |
| | | | | 257/E29.279 |
| 2009/0128017 | A1 | 5/2009 | Sagawa et al. | |
| 2011/0012123 | A1 | 1/2011 | Seong et al. | |
| 2013/0027623 | A1 | 1/2013 | Negishi et al. | |
| 2017/0250168 | A1 | 8/2017 | Do et al. | |
| 2018/0012876 | A1* | 1/2018 | Kim | H01L 33/387 |
| 2018/0019369 | A1* | 1/2018 | Cho | H01L 33/44 |
| 2018/0083194 | A1* | 3/2018 | Lee | H10K 71/00 |
| 2021/0013190 | A1 | 1/2021 | Kim et al. | |

FOREIGN PATENT DOCUMENTS

| | | |
|---|---|---|
| CN | 107623013 A | 1/2018 |
| EP | 2 546 900 A1 | 1/2013 |
| JP | 2008-83489 A | 4/2008 |
| KR | 10 0810632 B1 | 3/2008 |
| KR | 10-2008-0050795 A | 6/2008 |
| KR | 10-1436123 B1 | 11/2014 |
| KR | 10-1490758 B1 | 2/2015 |
| KR | 10-1713818 B1 | 3/2017 |
| KR | 10-2017-0112275 A | 10/2017 |
| KR | 10-2018-0007025 A | 1/2018 |
| KR | 10-1808517 B1 | 1/2018 |

OTHER PUBLICATIONS

Chinese Office Action issued in corresponding Patent Application No. CN201880095162.4, dated Jan. 8, 2024, 5 pages.

* cited by examiner

450b_12: 451b_12, 452b_6, 453b_12

DISPLAY DEVICE HAVING A LIGHT EMITTING ELEMENT BETWEEN A BRANCH WIRING AND A COMMON BRANCH WIRING

CROSS-REFERENCE TO RELATED APPLICATIONS

This application is a U.S. National Phase Patent Application of Korean International Application Number PCT/KR2018/011128, filed on Sep. 20, 2018, which claims priority to Korean Patent Application Number 10-2018-0073551, filed on Jun. 26, 2018, the entire contents of all of which are incorporated herein by reference.

BACKGROUND

1. Field

Aspects of embodiments of the present disclosure relate to a display device.

2. Related Art

The importance of display devices has steadily increased with the development of multimedia technology. Accordingly, various types of display devices, such as an organic light emitting display (OLED), a liquid crystal display (LCD), and the like, have been used.

A display device is a device for displaying an image and includes a display panel, such as an organic light emitting display panel or a liquid crystal display panel. Among the types of display panels, a light emitting display panel may include a light emitting element, such as a light emitting diode (LED). Examples of a light emitting diode (LED) include an organic light emitting diode (OLED) using an organic material as a fluorescent material and an inorganic light emitting diode using an inorganic material as a fluorescent material.

The organic light emitting diode (OLED), which uses an organic material as a fluorescent material of a light emitting element, has advantages in that a manufacturing process thereof is relatively simple and a display device including the OLED may be flexible. However, the organic material is vulnerable to a high-temperature operating environment, and the blue light efficiency (e.g., the blue light emission efficiency) is relatively low.

SUMMARY

According to an embodiment of the present disclosure, a display device includes a plurality of pixels, and each pixel may include a plurality of light emitting elements, for example, inorganic light emitting diodes. The plurality of light emitting elements emit different colors from each other so that each pixel of the display device may display a different color. When aligning the light emitting elements, a slot die coating method, an inkjet printing method, or the like may be used for each pixel on a pixel substrate of the display device. The light emitting elements may be aligned by printing a solution including the light emitting elements on the substrate and applying an AC power through wirings in each pixel.

However, when the solution is printed on the entire surface of the pixel substrate of the display device, light emitting elements that emit different colors may be aligned together in all of the pixels, thereby causing color mixing defects. On the other hand, when the solution is printed (or separately printed) for each pixel, the solution may overflow to different adjacent pixels such that a sophisticated printing technique must be used and the resolution of a manufactured display device may become problematic.

In view of the above, embodiments of the present disclosure provide a display device that can avoid or at least mitigate a color mixing problem caused by the mixing of light emitting elements between pixels by arranging different alignment signal wirings for each pixel.

It should be noted that aspects and features of the present disclosure are not limited to the above-mentioned aspects and features, and other aspects and features of the present disclosure will be clearly understood by those skilled in the art from the following descriptions.

According to an embodiment, a display device includes: a first pixel stem wiring and a common stem wiring extending in a first direction and spaced apart from each other; a first pixel branch wiring branched from the first pixel stem wiring and extending in a second direction crossing the first direction; a common branch wiring branched from the common stem wiring and extending in the second direction; and a first light emitting element between the first pixel branch wiring and the common branch wiring. The first pixel branch wiring includes a base branch pattern connected to the first pixel stem wiring, a separate branch pattern spaced apart from the base branch pattern, and a bridge wiring connecting the base branch pattern to the separate branch pattern The first pixel stem wiring, the base branch pattern, and the separate branch pattern may be in a first conductive layer, the bridge wiring may be in a second conductive layer on a different layer than the first conductive layer, and the first light emitting element may be between the common branch wiring and the separate branch pattern.

The common branch wiring may extend in one direction of the second direction, and the first pixel branch wiring may extend in an opposite direction of the one direction of the second direction.

A distal end of the first pixel branch wiring may be spaced apart from the common stem wiring, and the separate branch pattern of the first pixel branch wiring may be spaced apart from the common stem wiring.

The display device may further include: a second pixel stem wiring extending in the first direction and spaced apart from the first pixel stem wiring and the common stem wiring; a second pixel branch wiring branched from the second pixel stem wiring and extending in the second direction; and a second light emitting element between the second pixel branch wiring and the common branch wiring.

The bridge wiring may cross the first pixel stem wiring or the common stem wiring.

The second pixel stem wiring, the second pixel branch wiring, and the common stem wiring may be in the first conductive layer.

The bridge wiring may cross the common stem wiring, the common branch wiring may extend in one direction of the second direction, and the second pixel branch wiring may extend in the one direction of the second direction.

The display device may further include: a third pixel stem wiring extending in the first direction and spaced apart from the first pixel stem wiring; a third pixel branch wiring branched from the third pixel stem wiring and extending in the second direction; and a third light emitting element between the third pixel branch wiring and the common branch wiring.

The bridge wiring may cross the first pixel stem wiring or the common stem wiring.

The third pixel stem wiring and the first pixel stem wiring may be in the first conductive layer, and the bridge wiring and the third pixel stem wiring may be in the second conductive layer.

According to an embodiment, a display device includes: a pixel stem wiring and a common stem wiring extending in a first direction and spaced apart from each other; a pixel branch wiring branched from the pixel stem wiring and extending in a second direction crossing the first direction; a common branch wiring branched from the common stem wiring and extending in the second direction; and a light emitting element between the pixel branch wiring and the common branch wiring. The pixel stem wiring includes a first pixel stem wiring, a second pixel stem wiring, and a third pixel stem wiring, and the pixel branch wiring includes a base branch pattern connected to the pixel stem wiring, a separate branch pattern spaced apart from the base branch pattern, and a bridge wiring connecting the base branch pattern to the separate branch pattern. The pixel branch wiring includes a first pixel branch wiring branched in the second direction from the first pixel stem wiring, the pixel branch wiring further includes a second pixel branch wiring branched in the second direction from the second pixel stem wiring, and the pixel branch wiring further includes a third pixel branch wiring branched in the second direction from the third pixel stem wiring.

The common branch wiring includes: a first common branch wiring spaced apart from and facing the first pixel branch wiring; a second common branch wiring spaced apart from and facing the second pixel branch wiring; and a third common branch wiring spaced apart from and facing the third pixel branch wiring.

The display device may have a light emitting portion in which the light emitting element is arranged and a non-light emitting portion other than the light emitting portion, the first pixel stem wiring, the second pixel stem wiring, the third pixel stem wiring, and the common stem wiring may be in the non-light emitting portion, and the first pixel branch wiring, the second pixel branch wiring, the third pixel branch wiring, and the common branch wiring may be in the light emitting portion.

The non-light emitting portion may have a first non-light emitting portion at a first side of the light emitting portion and a second non-light emitting portion at an second side of the light emitting portion, and the first pixel stem wiring, the second pixel stem wiring, the third pixel stem wiring, or the common stem wiring may be in the first non-light emitting portion.

The first pixel stem wiring and the second pixel stem wiring may be spaced apart from each other in the first non-light emitting portion, the third pixel stem wiring and the common stem wiring may be spaced apart from each other in the second non-light emitting portion, and a shortest distance to the first pixel stem wiring and the common stem wiring from the light emitting portion may be smaller than a shortest distance to the second pixel stem wiring and the third pixel stem wiring from the light emitting portion.

The display device may further include: a first wiring layer including the pixel stem wiring, the base branch pattern, and the separate branch pattern; an insulating film layer having a first contact opening exposing the base branch pattern and a second contact opening exposing the separate branch pattern; and a second wiring layer including the bridge wiring that electrically connects the base branch pattern to the separate branch pattern through the first contact opening and the second contact opening in the insulating film layer. The bridge wiring may be in electrical contact with the pixel stem wiring.

The first pixel stem wiring, the second pixel stem wiring, and the third pixel stem wiring may be in the second wiring layer and may be in electrical contact with the bridge wiring.

The pixel stem wiring may include a stem separation wiring having regions that are electrically disconnected from each other, and adjacent regions of the stem separation wiring may be arranged in the first direction and are electrically connected to the pixel branch wiring.

The first pixel branch wiring, the second pixel branch wiring, and the third pixel branch wiring may include a branch separation wiring having regions that are electrically disconnected from each other, and the regions of the branch separation wiring may be arranged in the same direction as an extending direction of the first pixel branch wiring, the second pixel branch wiring, and the third pixel branch wiring.

The display device according to an embodiment includes a pixel stem wiring and a pixel branch wiring branched from the pixel stem wiring in each pixel. Each pixel branch wiring is electrically separated from other pixel branch wirings in adjacent pixels, and a separate alignment signal may be applied to each pixel branch wiring. Accordingly, when aligning the light emitting elements, a different alignment signal may be applied to each pixel so that only some of the light emitting elements (e.g., only specific light emitting elements) may be aligned in a corresponding pixel. Therefore, color mixing that may be caused by the mixing of the light emitting elements between pixels of the display device may be avoided or at least mitigated.

Aspects and features of the present disclosure are not limited to those mentioned above and various other aspects and features are included herein and are described in the following detailed description and in the appended drawings.

DETAILED DESCRIPTION

Figure 1:
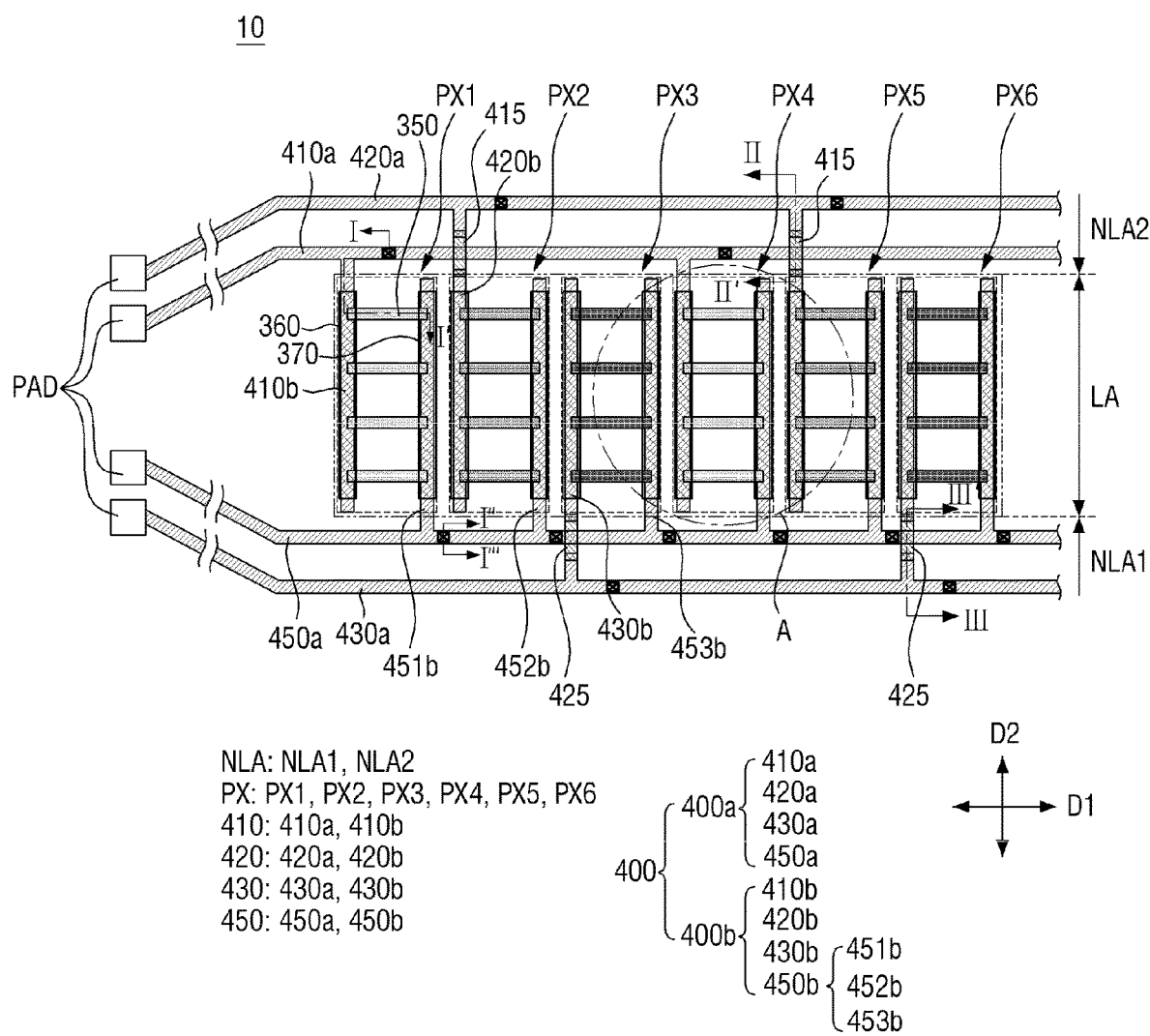
FIG. 1 is a plan view of a display device according to an embodiment.

The present disclosure will now be described more fully hereinafter with reference to the accompanying drawings, in which example embodiments of the present disclosure are shown. The present disclosure may, however, be embodied in different forms and should not be construed as limited to the embodiments set forth herein. Rather, these embodiments are provided so that this disclosure will be thorough and complete and will fully convey the scope of the present disclosure to those skilled in the art.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements.

In the figures, dimensions of the various elements, layers, etc. may be exaggerated for clarity of illustration. The same reference numerals designate the same elements. As used herein, the term "and/or" includes any and all combinations of one or more of the associated listed items. Further, the use of "may" when describing embodiments of the present disclosure relates to "one or more embodiments of the present disclosure." Expressions, such as "at least one of," when preceding a list of elements, modify the entire list of elements and do not modify the individual elements of the list. As used herein, the terms "use," "using," and "used" may be considered synonymous with the terms "utilize," "utilizing," and "utilized," respectively. As used herein, the terms "substantially," "about," and similar terms are used as terms of approximation and not as terms of degree, and are intended to account for the inherent variations in measured or calculated values that would be recognized by those of ordinary skill in the art.

It will be understood that, although the terms first, second, third, etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

The terminology used herein is for the purpose of describing particular example embodiments of the present disclosure and is not intended to be limiting of the described example embodiments of the present disclosure. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

Hereinafter, embodiments of the present disclosure will be described with reference to the accompanying drawings.

Figure 2:
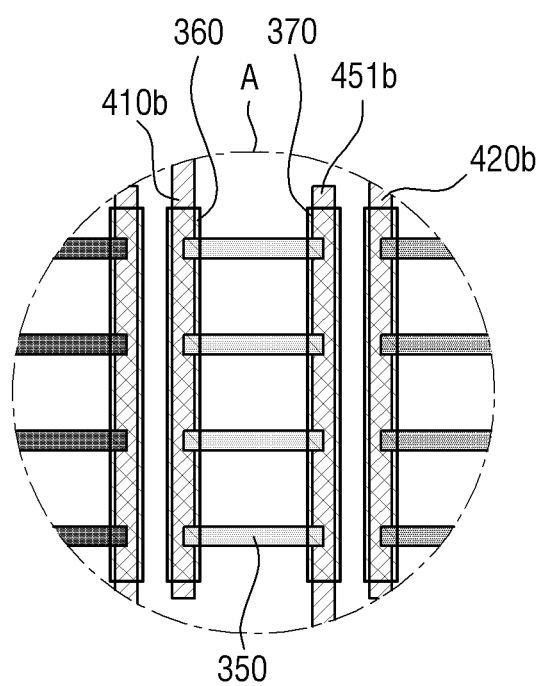
FIG. 2 is an enlarged view of the portion A of FIG. 1.

FIG. 1 is a plan view of a display device according to an embodiment, and FIG. 2 is an enlarged view of the portion A of FIG. 1.

Referring to FIG. 1, a display device 10 may have areas defined as a light emitting portion LA and a non-light emitting portion NLA. A light emitting element 350 is provided in the light emitting portion LA to display light of a specific color. The non-light emitting portion NLA may be defined as an area other than the light emitting portion LA. The non-light emitting portion NLA may be covered by suitable members so as not to be viewed from the outside of the display device 10. Various members for driving the light emitting element 350 disposed in the light emitting portion LA may be disposed in the non-light emitting portion NLA. For example, the non-light emitting portion NLA may include a wiring, a circuit unit (e.g., a circuit), and a driving unit (e.g., a driver) for applying an electrical signal to the light emitting portion LA, but the present disclosure is not limited thereto.

The display device 10 includes a plurality of pixels PX disposed in the light emitting portion LA. Each of the plurality of pixels PX may display light in a specific wavelength band to the outside of the display device 10. Although six pixels PX (e.g., PX1-PX6) are shown in FIG. 1, the display device 10 may include a greater number of pixels. Although the plurality of pixels PX are illustrated as being arranged only in a first direction D1, the plurality of pixels PX may be also arranged in a second direction D2 crossing (e.g., perpendicular to) the first direction D1. Further, each of the pixels PX shown in FIG. 1 may be divided into a plurality of portions, and each portion may constitute one pixel PX. The pixels PX are not necessarily arranged in parallel only in the first direction D1 as shown in FIG. 1. For example, the pixels PX may be variously arranged, such as in a vertical direction (e.g., the second direction D2) or in a zigzag pattern.

The plurality of pixels PX may display colors by including one or more light emitting elements 350 emitting light in a specific wavelength band. The light emitted from the light emitting element 350 may be viewed from the outside at the light emitting portion LA of the display device 10. In an embodiment in which each pixel PX displays a different color, each pixel PX may include a light emitting element 350 emitting a different color. For example, a first pixel PX1 and a fourth pixel PX4 displaying red may include a light emitting element 350 that emits red light. A second pixel PX2 and a fifth pixel PX5 displaying green may include a light emitting element 350 that emits green light. A third pixel PX3 and a sixth pixel PX6 displaying blue may include a light emitting element 350 that emits blue light. However, the present disclosure is not limited thereto. In some embodiments, pixels PX displaying different colors may include a light emitting element 350 that emits the same color (e.g., blue) and a wavelength conversion layer or a color filter may be disposed on (or along) a light emission path to implement a color of each pixel.

The display device 10 may include a plurality of wirings 400 and a plurality of light emitting elements 350. At least a portion of (e.g., at least some of) the plurality of wirings 400 is disposed in each pixel PX and is electrically connected to the light emitting elements 350, and electrical signals may be applied to the light emitting elements 350 so that the light emitting elements 350 emit light (e.g., emit light of a specific color). Further, at least a portion of the plurality of wirings 400 may be utilized to form an electric field in the pixel PX to align the light emitting elements 350. When aligning the light emitting elements 350 that emit different colors in the plurality of pixels PX, the different light emitting elements 350 should be accurately aligned in each pixel PX. When aligning the light emitting elements 350 using dielectrophoresis, a solution containing the light emitting elements 350 is applied to the display device 10, and AC power is applied thereto to form an electric field. Then, a dielectrophoretic force may be applied to the light emitting elements 350 to align the light emitting elements 350.

When the solution is coated on the entire surface of the display device 10, different light emitting elements 350 may be arranged by mixture in all of the pixels PX, thereby causing color mixing defects of the display device 10. In addition, when the solution is partially coated on each pixel PX, the solution may overflow to adjacent pixels PX, causing color mixing defects, and thus, a sophisticated coating technique is often used.

When the plurality of wirings 400 of different types is (e.g., when different ones of the wirings 400 are) arranged in each pixel PX, a different electrical signal may be applied to each pixel PX when the light emitting elements 350 are aligned. Accordingly, an electric field may be selectively formed for each pixel PX, and the light emitting elements 350 emitting different colors may be selectively aligned so as not to be mixed in each pixel PX.

The plurality of wirings 400 may include a common wiring 450 and pixel wirings 410, 420, and 430. The pixel wirings 410, 420, 430 and the common wiring 450 may include a stem wiring 400a (e.g., stem wirings 410a, 420a, 430a, 450a, respectively) extending in the first direction D1 and a plurality of branch wirings 400b (e.g., branch wirings 410b, 420b, 430b, 450b, respectively) branched from the stem wiring 400a and extending in the second direction D2.

For example, one end of a common stem wiring 450a, which is a stem wiring of the common wiring 450, may be connected to a signal applying pad PAD, and the other end of the common stem wiring 450a may extend to other pixels PX adjacent to each other in the first direction D1. The signal applying pad PAD may be connected to the display device 10 or to an external power source to apply an electrical signal to the common wiring 450. The plurality of pixels PX adjacent to each other in the first direction D1 may share) the extended common stem wiring 450a (e.g., the common stem wiring 450a may extend along the plurality of pixels PX in the first direction D1).

A common branch wiring 450b (e.g., common branch wirings 451b, 452b, and 453b) is branched from the common stem wiring 450a and extends in the second direction D2. The common branch wiring 450b may be terminated while being spaced apart from the pixel stem wirings 410a, 420a, 430a that face the common stem wiring 450a. For example, the common branch wiring 450b may be disposed in the pixel PX with one end connected to the common stem wiring 450a and the other end spaced apart from another stem wiring (e.g., spaced apart from the pixel stem wirings 410a, 420a, and 430a). A plurality of common branch wirings 450b is branched from the common stem wiring 450a with a space therebetween so that the common branch wiring 450b (e.g., so that one of the common branch wirings 451b, 452b, 453b) may be disposed in each pixel PX. Because the plurality of common branch wirings 450b have one end connected to the common stem wiring 450a, the same electrical signal may be applied to each pixel PX.

The pixel wirings 410, 420, 430 may include a first pixel wiring 410, a second pixel wiring 420, and a third pixel wiring 430, each disposed in the pixel PX displaying a different color.

For example, one end of the pixel stem wirings 410a, 420a, 430a of the pixel wirings 410, 420, 430 may be connected to one of the signal applying pads PAD, and the other end thereof may extend to other pixels PX adjacent to each in the first direction D1. Accordingly, the pixel wirings 410, 420, 430 may receive electrical signals from the signal applying pads PAD, and the adjacent pixels PX may share the pixel stem wirings 410a, 420a, and 430a.

Pixel branch wirings 410b, 420b, 430b are branched from the respective pixel stem wirings 410a, 420a, 430a and extend in the second direction D2. The pixel branch wirings 410b, 420b, 430b may be terminated while being spaced apart from the common stem wiring 450a or other pixel stem wirings 410a, 420a, 430a disposed to face an arbitrary pixel stem wiring 410a, 420a, 430a. For example, the pixel branch wirings 410b, 420b, 430b may be disposed in the pixels PX with one end connected to the respective pixel stem wiring 410a, 420a, 430a and the other end spaced apart from other stem wirings.

A first pixel branch wiring 410b, a second pixel branch wiring 420b, and a third pixel branch wiring 430b may be respectively disposed in pixels PX displaying different colors. For example, as illustrated in FIG. 1, the first pixel wiring 410 may be disposed in the first pixel PX1 and the fourth pixel PX4, which emit red light, the second pixel wiring 420 may be disposed in the second pixel PX2 and the fifth pixel PX5, which emit green light, and the third pixel wiring 430 may be disposed in the third pixel PX3 and the sixth pixel PX6, which emit blue light. Different electrical signals are applied through the pixel wirings 410, 420, 430 arranged in each pixel PX to control light emission of the light emitting elements 350 disposed in each pixel PX. Accordingly, a color displayed by the pixels PX of the display device 10 may be adjusted or controlled.

In addition, the pixel wirings 410, 420, 430 may be divided and spaced apart in some portions of the pixel stem wirings 410a, 420a, 430a or the pixel branch wirings 410b, 420b, 430b. Different from the common wiring 450, the pixel wirings 410, 420, and 430 may receive different electrical signals for each pixel PX. Accordingly, the pixel wirings 410, 420, and 430 may be separately driven even when they are disposed in the pixels PX displaying the same color. A more detailed description thereof will be provided below with reference to other drawings.

In some embodiments, the common wiring 450 is a common electrode disposed in each pixel PX, and the pixel wiring 410, 420, 430 may be a pixel electrode. In addition, any one of the common wiring 450 and the pixel wiring 410, 420, 430 may be an anode electrode, and the other one may be a cathode electrode. However, the present disclosure is not limited thereto, and the opposite may be the case.

The common stem wiring 450a, a first pixel stem wiring 410a, a second pixel stem wiring 420a, and a third pixel stem wiring 430a may be separated from each other with respect to the light emitting portion LA (e.g., may be on opposite sides of the light emitting portion LA) and may be disposed in different non-light emitting portions NLA. For example, some of the four wirings may be disposed in a first non-light emitting portion NLA1 located at one side of the light emitting portion LA, and the remaining wirings may be disposed in a second non-light emitting portion NLA2 located at the other side of the light emitting portion LA. The other side of the light emitting portion LA may be in an opposite direction to the one side but is not limited thereto.

According to an embodiment, in the plurality of wirings 400, two different types of wirings form one pair, and the wirings forming one pair may be divided to be disposed at one side and the other side with respect to the light emitting portion LA. For example, as shown in FIG. 1, the common stem wiring 450a and the third pixel stem wiring 430a may be disposed under the light emitting portion LA (e.g., may be disposed in the first non-light emitting portion NLA1), and the first pixel stem wiring 410a and the second pixel stem wiring 420a may be disposed above the light emitting portion LA (e.g., may be disposed in the second non-light emitting portion NLA2). By dividing and arranging four different wirings 410a, 420a, 430a, 450a in the display device 10 into the non-light emitting portions NLA with respect to the light emitting portion LA, the area of the non-light-emitting portions NLA may be reduced or minimized. The plurality of wirings 400 may be divided and arranged to increase or maximize the area of the light emitting portion LA.

However, the present disclosure is not limited thereto, and the arrangement of the plurality of wirings 400 is not particularly limited as long as the plurality of wirings 400 are divided and disposed at one side and the other side with respect to the light emitting portion LA. In some embodiments, the plurality of wirings 400 may be disposed spaced apart from each other at the right and left sides with respect to the light emitting portion LA. In some embodiments, four wirings may be divided into one wiring and the other three wirings and arranged in that way, or all four wirings may be disposed at one side of the light emitting portion LA.

The stem wirings forming one pair may be arranged spaced apart from each other. For example, the common stem wiring 450a and the third pixel stem wiring 430a disposed in the first non-light emitting portion NLA1 may be spaced apart from each other, and the first pixel stem wiring 410a and the second pixel stem wiring 420a disposed in the second non-light emitting portion NLA2 may also be spaced apart from each other. In addition, the common stem wiring 450a and the first pixel stem wiring 410a may be disposed in a region relatively adjacent to (e.g., nearer to) the light emitting portion LA, and the third pixel stem wiring 430a and the second pixel stem wiring 420a may be disposed in a region relatively far from (e.g., farther from) the light emitting portion LA while being spaced apart by a distance from the common stem wiring 450a and the first pixel stem wiring 410a, respectively. However, the present disclosure is not limited thereto and may have different arrangement structures.

In addition, as described above, the common branch wiring 450b, the first pixel branch wiring 410b, the second pixel branch wiring 420b, and the third pixel branch wiring 430b may be disposed within the pixels PX of the light emitting portion LA. Accordingly, at least a portion of the common wiring 450, the first pixel wiring 410, the second pixel wiring 420, and the third pixel wiring 430 may be disposed in the non-light emitting portion NLA, and the other portions may be disposed in the light emitting portion LA. However, the present disclosure is not limited thereto, and in some embodiments, some stem wirings of the four wirings may also be arranged in the light emitting portion LA.

In one pixel PX, the pixel branch wiring 410b, 420b, 430b may be disposed in a pair with the common branch wiring 450b. In addition, branch wirings forming one pair are arranged to face each other while being spaced apart from each other. For example, the first pixel branch wiring 410b and a first common branch wiring 451b are disposed in a pair in the first pixel PX1, the second pixel branch wiring 420b and a second common branch wiring 452b are disposed in a pair in the second pixel PX2, and the third pixel branch wiring 430b and a third common branch wiring 453b are disposed in a pair in the third pixel PX3.

The common branch wiring 450b and the pixel branch wiring 410b, 420b, 430b are branched from the common stem wiring 450a and the pixel stem wiring 410a, 420a, 430a, respectively, so that the arrangement structure of the branch wirings within the pixel PX may partially differ depending on the arrangement of the stem wirings.

For example, when the first pixel stem wiring 410a and the second pixel stem wiring 420a are disposed in a direction opposite to the common stem wiring 450a with respect to the light emitting portion LA, branch wirings branched from each stem wiring and disposed within the pixels PX may extend in opposite directions. For example, the first pixel branch wiring 410b and the second pixel branch wiring 420b respectively disposed in the first pixel PX1 and the second pixel PX2 may extend in one of the second directions D2, and the first common branch wiring 451b and the second common branch wiring 452b may extend in an opposite direction to the one of the second directions D2. Therefore, the first pixel branch wiring 410b and the second pixel branch wiring 420b are parallel to the first common branch wiring 451b and the second common branch wiring 452b, respectively, but only partial portions of their side surfaces may overlap each other on the same plane (e.g., the wirings in the same pixel PX only partially overlap in the first direction D1). The ends of the first pixel branch wiring 410b and the second pixel branch wiring 420b and the ends of the first common branch wiring 451b and the second common branch wiring 452b may be disposed at the opposite sides of the pixel PX with respect to the center of the pixels PX, respectively.

When the third pixel stem wiring 430a disposed at the same side of the light emitting portion LA as the common stem wiring 450a, branch wirings branched from each stem wiring and disposed within the pixels PX may extend in the same direction. For example, the third pixel branch wiring 430b disposed in the third pixel PX3 may extend in one of the second directions D2, and the third common branch wiring 453b may also extend in the one of the second directions D2. Therefore, the third pixel branch wiring 430b may be parallel to the third common branch wiring 453b and their side surfaces may substantially overlap each other on the same plane. The end of the third pixel branch wiring 430b and the end of the third common branch wiring 453b may be disposed at the same side of the pixel PX with respect to the center of the pixel PX.

However, the present disclosure is not limited thereto. In some embodiments, one or more pixel branch wirings 410b, 420b, and 430b may extend in the same direction as the common branch wiring 450b, and the ends thereof may be disposed at the same side with respect to the center of the light emitting portion LA. As described above, the configurations of the branch wirings 410b, 420b, 430b, and 450b may vary depending on the arrangement of the common stem wiring 450a and the pixel stem wirings 410a, 420a, and 430a.

The pixel branch wiring 410b, 420b, 430b and the common branch wiring 450b that are disposed to face each other with a space therebetween within one pixel PX may be a pixel electrode 330 and a common electrode 340 of the display device 10, respectively. The above-described light emitting element 350 may be disposed between the pixel branch wiring 410b, 420b, 430b and the common branch wiring 450b that face each other. One end of the light emitting element 350 may be connected to the pixel branch wiring 410b, 420b, 430b, and the other end of the light emitting element 350 may be connected to the common branch wiring 450b. Accordingly, the light emitting element 350 may emit color by receiving an electrical signal through the pixel branch wiring 410b, 420b, 430b and the common branch wiring 450b.

Referring to FIG. 2, a plurality of light emitting elements 350 may be disposed between the common branch wiring 450b and an arbitrary pixel branch wiring 410b, 420b, 430b (e.g., between the common branch wiring 450b and one of the pixel branch wirings 410b, 420b, and 430b). As described above, the ends of the light emitting element 350 may respectively contact the pixel branch wiring 410b, 420b, 430b and the common branch wiring 450b that are disposed to face each other while being spaced apart from each other. In this embodiment, the light emitting element 350 may be disposed (e.g., may extend) substantially perpendicular to the pixel branch wiring 410b, 420b, 430b and the common branch wiring 450b and substantially parallel to the pixel stem wiring 410a, 420a, 430a and the common stem wiring 450a.

In some embodiments, the common branch wiring 450b and the pixel branch wiring 410b, 420b, 430b that are spaced apart within one pixel PX may further include a sub-branch wiring that is branched from each branch wiring 410b, 420b, 430b, 450b and disposed in the pixel PX. Accordingly, the arrangement structure of the light emitting elements 350 disposed between the common branch wiring 450b and the pixel branch wiring 410b, 420b, 430b may be suitably varied. In addition, when each branch wiring 400b further includes the sub-branch wiring 400c, an electric field formed during the alignment of the light emitting elements 350 may be concentrated between the sub-branch wirings 400c, and accordingly, the alignment accuracy of the light emitting elements 350 may be improved. The common branch wiring 450b and the pixel branch wiring 410b, 420b, 430b are not necessarily linear and may have various structures, forms, or shapes, such as a curved or zigzag shape. A detailed description thereof will be described later with reference to other embodiments.

Hereinafter, a cross-sectional structure of the light emitting portion LA of the display device 10 will be described in detail with reference to FIG. 3.

Figure 3:
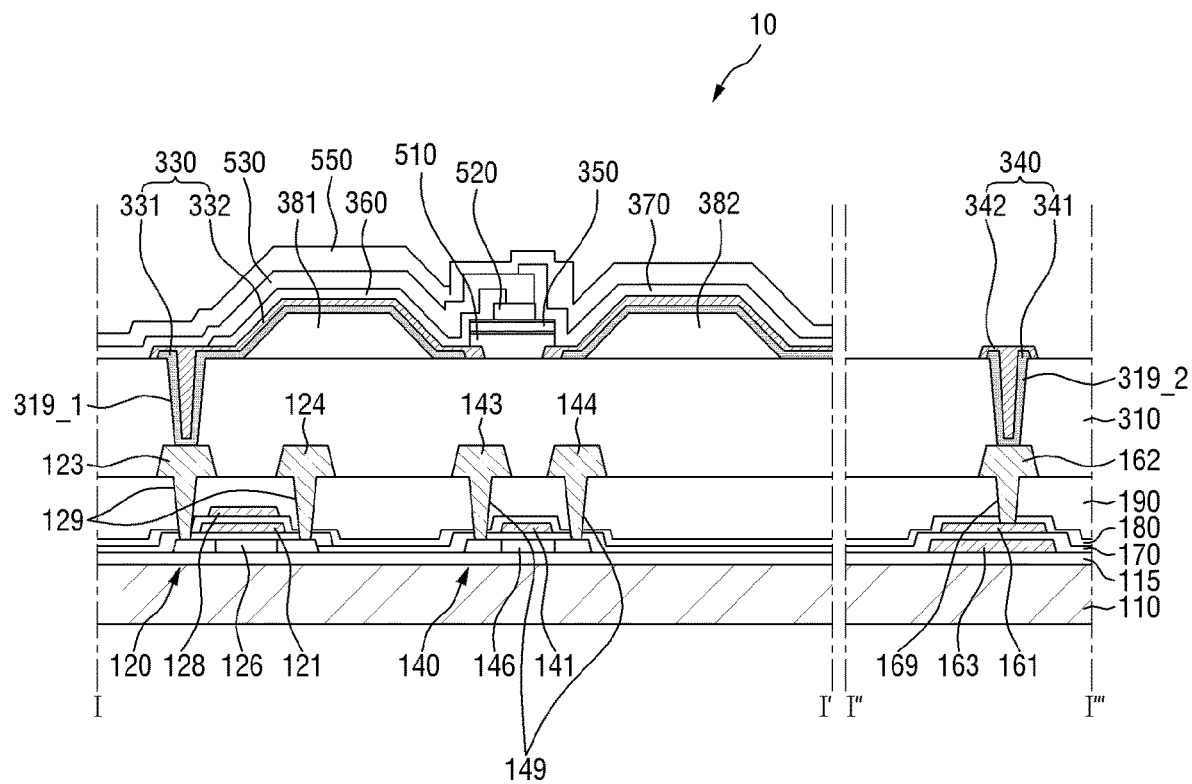
FIG. 3 is a cross-sectional view taken along the lines I-I' and I''-I''' of FIG. 1.

FIG. 3 is a cross-sectional view taken along the lines I-I' and I''-I''' of FIG. 1. FIG. 3 illustrates a cross-sectional view of a single pixel PX disposed in the light emitting portion LA of the display device 10 according to an embodiment.

Referring to FIGS. 1 and 3, the display device 10 may include a substrate 110, thin film transistors 120 and 140 disposed on the substrate 110, the electrodes 330 and 340 disposed on the thin film transistors 120 and 140, and the light emitting element 350. The thin film transistors 120 and 140 may include a first thin film transistor 120 acting as a driving transistor and a second thin film transistor 140 acting as a switching transistor. Each thin film transistor may include an active layer, a gate electrode, a source electrode, and a drain electrode. The pixel electrode 330 may be electrically connected to the drain electrode of the first thin film transistor (e.g., the first driving transistor) 120.

The substrate 110 may be an insulating substrate. The substrate 110 may include (or may be made of) an insulating material, such as glass, quartz, or polymer resin. Examples of the polymeric material may include polyethersulfone (PES), polyacrylate (PA), polyarylate (PAR), polyetherimide (PEI), polyethylene naphthalate (PEN), polyethylene terephthalate (PET), polyphenylene sulfide (PPS), polyarylate, polyimide (PI), polycarbonate (PC), cellulose triacetate (CAT), cellulose acetate propionate (CAP), or a combination thereof. The substrate 110 may be a rigid substrate or may be a flexible substrate that can be bent, folded or rolled.

A buffer layer 115 may be disposed on the substrate 110. The buffer layer 115 can prevent (or substantially prevent) diffusion of impurity ions, prevent (or substantially prevent) penetration of moisture or external air, and provide a planarized surface. The buffer layer 115 may include silicon nitride, silicon oxide, silicon oxynitride, or the like.

A semiconductor layer is disposed on the buffer layer 115. The semiconductor layer may include a first active layer 126 of the first thin film transistor 120, a second active layer 146 of the second thin film transistor 140, and an auxiliary layer 163. The semiconductor layer may include polycrystalline silicon, monocrystalline silicon, oxide semiconductor, and the like.

A first gate insulating layer 170 is disposed on the semiconductor layer. The first gate insulating layer 170 covers the semiconductor layer. The first gate insulating layer 170 may act as a gate insulating film of the thin film transistor. The first gate insulating layer 170 may include silicon oxide, silicon nitride, silicon oxynitride, aluminum oxide, tantalum oxide, hafnium oxide, zirconium oxide, titanium oxide, or the like. These materials may be used alone or in combination with each other.

A first conductive layer is disposed on the first gate insulating layer 170. The first conductive layer may include a first gate electrode 121 disposed on the first active layer 126 of the first thin film transistor 120, a second gate electrode 141 disposed on the second active layer 146 of the second thin film transistor 140, and a power wiring 161 disposed on the auxiliary layer 163 with the first gate insulating layer 170 interposed therebetween, respectively. The first conductive layer may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The first conductive layer may be a single layer or a multilayer structure.

A second gate insulating layer 180 is disposed on the first conductive layer. The second gate insulating layer 180 may be an interlayer insulating layer. The second gate insulating layer 180 may include (or may be formed of) an inorganic insulating material, such as silicon oxide, silicon nitride, silicon oxynitride, hafnium oxide, aluminum oxide, titanium oxide, tantalum oxide, zinc oxide, and the like.

A second conductive layer is disposed on the second gate insulating layer 180. The second conductive layer includes a capacitor electrode 128 disposed on the first gate electrode 121 with the second gate insulating layer 180 interposed therebetween. The capacitor electrode 128 may form a storage capacitor together with the first gate electrode 121.

Similar to the first conductive layer described above, the second conductive layer may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

An interlayer insulating layer 190 is disposed on the second conductive layer. The interlayer insulating layer 190 may be an interlayer insulating film. Further, the interlayer insulating layer 190 may provide a planarized surface (e.g., a planar upper surface). The interlayer insulating layer 190 may include an organic insulating material selected from the group consisting of an acrylic resin, an epoxy resin, a phenolic resin, a polyamide resin, a polyimide resin, an unsaturated polyester resin, a polyphenylene resin, a polyphenylene sulfide resin, and benzocyclobutene (BCB).

A third conductive layer is disposed on the interlayer insulating layer 190. The third conductive layer includes a first drain electrode 123 and a first source electrode 124 of the first thin film transistor 120, a second drain electrode 143 and a second source electrode 144 of the second thin film transistor 140, and a power electrode 162 disposed on the power wiring 161.

The first source electrode 124 and the first drain electrode 123 may be electrically connected to the first active layer 126 through a first contact opening (e.g., a first contact hole) 129 passing through the interlayer insulating layer 190 and the second gate insulating layer 180. The second source electrode 144 and the second drain electrode 143 may be electrically connected to the second active layer 146 through a second contact opening (e.g., a second contact hole) 149 passing through the interlayer insulating layer 190 and the second gate insulating layer 180. The power electrode 162 may be electrically connected to the power wiring 161 through a third contact opening (e.g., a third contact hole) 169 passing through the interlayer insulating layer 190 and the second gate insulating layer 180.

The third conductive layer may include at least one metal selected from the group consisting of aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The third conductive layer may be a single layer or a multilayer structure. For example, the third conductive layer may have a stacked structure of Ti/Al/Ti, Mo/Al/Mo, Mo/AlGe/Mo, or Ti/Cu.

An insulating substrate layer 310 is disposed on the third conductive layer. The insulating substrate layer 310 may include (or may be formed of) an organic insulating material selected from the group consisting of an acrylic resin, an epoxy resin, a phenolic resin, a polyamide resin, a polyimide resin, an unsaturated polyester resin, a polyphenylene resin, a polyphenylene sulfide resin, and benzocyclobutene (BCB). The surface of the insulating substrate layer 310 may be flat.

A partition wall 380 may be disposed on the insulating substrate layer 310. At least a portion of the pixel wiring 410, 420, and 430 and at least a portion of the common wiring 450 may be disposed on the partition wall 380. For example, the partition wall 380 may include a first partition wall 381 on which the pixel branch wiring 410b, 420b, 430b is disposed and a second partition wall 382 on which the common branch wiring 450b is disposed. Although one first partition wall 381 and one second partition wall 382 are illustrated in FIG. 3, a number of partition walls corresponding to the number of branches may be provided in one pixel PX. For example, in an embodiment having the arrangement structure shown in FIG. 1, the number of the first partition wall 381 and the number of the second partition wall 382 disposed in one pixel is one, respectively.

However, the present disclosure is not limited thereto, and the partition wall 380 disposed on the insulating substrate layer 310 may be omitted. For example, the common branch wiring 450b and the pixel branch wiring 410b, 420b, 430b may be directly disposed on the insulating substrate layer 310. In this embodiment, different from the embodiment shown in FIG. 3, a stepped portion, which may be formed by members disposed on the insulating substrate layer 310, may be relatively small.

The pixel branch wiring 410b, 420b, 430b disposed on the first partition wall 381 and the common branch wiring 450b disposed on the second partition wall 382 may include a partition reflective layer 331, 341 and a partition electrode layer 332, 342 and may form the pixel electrode 330 and the common electrode 340, respectively. For example, at least a portion of the common wiring 450 and the pixel wiring 410, 420, 430 disposed in each pixel PX may be the pixel electrode 330 or the common electrode 340 within the pixel PX.

The first partition reflective layer 331 and the second partition reflective layer 341 may be disposed on the partition wall 380.

The first partition reflective layer 331 covers the first partition wall 381 and is electrically connected to the first drain electrode 123 of the first thin film transistor 120 through a fourth contact opening (e.g., a fourth contact hole) 319_1 passing through the insulating substrate layer 310. The second partition reflective layer 341 is disposed spaced apart from the first partition reflective layer 331. The second partition reflective layer 341 covers the second partition wall 382 and is electrically connected to the power electrode 162 through a fifth contact opening (e.g., a fifth contact hole) 319_2 passing through the insulating substrate layer 310. The first partition reflective layer 331 may be electrically connected to the first drain electrode 123 of the first thin film transistor 120 through the fourth contact opening 319_1 in the light emitting portion LA of the display device 10. The first thin film transistor 120 may be disposed in a region overlapping the light emitting portion LA.

FIG. 3 illustrates an embodiment in which the second partition reflective layer 341 is connected to the common stem wiring 450a through the fifth contact opening 319_2 located in the non-light emitting portion NLA of each pixel. However, the present disclosure is not limited thereto, and the second partition reflective layer 341 may be connected to the common branch wiring 450b through a contact opening (e.g., a contact hole) located in the light emitting portion LA of each pixel or may be connected to the common branch wiring 450b through the fifth contact opening 319_2 in the non-light emitting portion NLA located at the outer side of the display device 10.

The light emitting element 350 may not be disposed in the non-light emitting portion NLA located at the outer side of the display device 10. As described above, the common electrodes 340 of the pixels PX are electrically connected to each other through the common stem wiring 450a, and thus, the same electrical signal may be applied thereto. In some embodiments, referring to the common electrode 340, the common stem wiring 450a may be electrically connected to the power electrode 162 through one contact opening (e.g., one contact hole) in the non-light emitting portion NLA located at the outer side of the display device 10. Accordingly, the same electrical signal may be applied to the common branch wirings 450*b* connected to the common stem wiring 450*a*. However, the present disclosure is not limited thereto. The position of the contact opening for the common electrode 340 to receive the electrical signal from the power electrode 162 may vary depending on the structure of the display device 10.

The first partition reflective layer 331 and the second partition reflective layer 341 may reflect light emitted from the light emitting element 350 to transmit light in the outer direction of the display device 10. The light emitted from the light emitting element 350 proceeds in all directions without direction, but light directed to the first partition reflective layer 331 and the second partition reflective layer 341 may be reflected and transmitted in the outer direction of the display device 10 (e.g., toward the top of the partition wall 380). Accordingly, the light emitted from the light emitting element 350 may be concentrated in one direction to increase light efficiency (e.g., to increase light extraction efficiency). The first partition reflective layer 331 and the second partition reflective layer 341 may include a material having a high reflectivity to reflect light emitted from the light emitting element 350. For example, the first partition reflective layer 331 and the second partition reflective layer 341 may include a material, such as silver (Ag) or copper (Cu), but are not limited thereto.

The first partition electrode layer 332 and the second partition electrode layer 342 may be disposed on the first partition reflective layer 331 and the second partition reflective layer 341, respectively.

The first partition electrode layer 332 is disposed directly on the first partition reflective layer 331. The first partition electrode layer 332 may have substantially the same pattern as the first partition reflective layer 331.

The second partition electrode layer 342 is disposed directly on the second partition reflective layer 341. The second partition electrode layer 342 is disposed to be separated from the first partition electrode layer 332. The second partition electrode layer 342 may have substantially the same pattern as the second partition reflective layer 341.

In an embodiment, the first partition electrode layer 332 and the second partition electrode layer 342 may cover the first partition reflective layer 331 and the second partition reflective layer 341 thereunder, respectively. For example, the first partition electrode layer 332 and the second partition electrode layer 342 may be formed to be larger than the first partition reflective layer 331 and the second partition reflective layer 341 to cover the side surfaces of the ends of the first partition reflective layer 331 and the second partition reflective layer 341. However, the present disclosure is not limited thereto.

The first partition electrode layer 332 and the second partition electrode layer 342 may transmit electrical signals sent to the first partition reflective layer 331 and the second partition reflective layer 341 to contact electrodes. The partition electrode layers 332 and 342 may include a transparent conductive material. For example, the first partition electrode layer 332 and the second partition electrode layer 342 may include a material, such as indium tin oxide (ITO), indium zinc oxide (IZO), or indium tin-zinc oxide (ITZO), but are not limited thereto. In some embodiments, the partition reflective layer 331, 341 and the partition electrode layer 332, 342 may have a structure in which at least one transparent conductive layer, such as ITO, IZO, or ITZO, and at least one metal layer, such as silver (Ag) or copper (Cu) are stacked. For example, the partition reflective layer 331, 341 and the partition electrode layer 332, 342 may form a stacked structure of ITO/Ag/ITO.

The first partition reflective layer 331 and the first partition electrode layer 332 disposed on the first partition wall 381 form the pixel branch wiring 410*b*, 420*b*, 430*b*, which forms the pixel electrode 330. The pixel electrode 330 may protrude to regions extending from both ends of the first partition wall 381, and accordingly, the pixel electrode 330 may contact the insulating substrate layer 310 in the protruding region. In addition, the second partition reflective layer 341 and the second partition electrode layer 342 disposed on the second partition wall 382 form the common branch wiring 450*b*, which forms the common electrode 340. The common electrode 340 may protrude to regions extending from both ends of the second partition wall 382, and accordingly, the common electrode 340 may contact the insulating substrate layer 310 in the protruding region.

For example, the pixel branch wiring 410*b*, 420*b*, 430*b* and the common branch wiring 450*b* each may include the partition reflective layer 331, 341 and the partition electrode layer 332, 342 and may have a stacked structure thereof. In addition, as described above, the pixel branch wiring 410*b*, 420*b*, 430*b* and the common branch wiring 450*b* may form the pixel electrode 330 and the common electrode 340, respectively. However, the present disclosure is not limited thereto.

The pixel electrode 330 and the common electrode 340 may be disposed to cover all areas of (e.g., to entirely cover) the first partition wall 381 and the second partition wall 382, respectively. However, the pixel electrode 330 and the common electrode 340 are disposed to face each other while being spaced apart from each other. As described below in more detail, a first insulating layer 510 may be disposed in a space where the pixel electrode 330 and the common electrode 340 are separated (e.g., in an area between the pixel electrode 330 and the common electrode 340), and the light emitting element 350 may be disposed on the first insulating layer 510.

In addition, the first partition reflective layer 331 may receive a driving voltage from the first thin film transistor 120, and the second partition reflective layer 341 may receive a power voltage from the power wiring 161. Thus, the pixel electrode 330 and the common electrode 340 receive the driving voltage and the power voltage, respectively. As described below in more detail, a first contact electrode 360 and a second contact electrode 370 disposed on the pixel electrode 330 and the common electrode 340, respectively, transfer the driving voltage and the power voltage to the light emitting element 350. Accordingly, light may be emitted from the light emitting element 350 while a current (e.g., a predetermined current) flows therethrough.

The first insulating layer 510 is disposed on a portion of the pixel electrode 330 and the common electrode 340. The first insulating layer 510 may be disposed in the space between the pixel electrode 330 and the common electrode 340. The first insulating layer 510 may have a linear shape or island-like shape formed along a space between the branch portions of the pixel electrode 330 and the common electrode 340 in a plan view.

The light emitting element 350 is disposed on the first insulating layer 510. The first insulating layer 510 may be disposed between the light emitting element 350 and the insulating substrate layer 310. The bottom surface of the first insulating layer 510 contacts the insulating substrate layer 310, and the light emitting element 350 may be disposed on the top surface of the first insulating layer 510. In addition, opposite sides of the first insulating layer 510 may contact the pixel electrode 330 and the common electrodes 340, respectively, to electrically insulate the pixel electrode 330 and the common electrodes 340 from each other.

The first insulating layer 510 may overlap a portion of the pixel electrode 330 and the common electrode 340 (e.g., a portion of the region where the pixel electrode 330 and the common electrode 340 protrude in opposite directions). For example, opposite side ends of the first insulating layer 510 may cover the upper surface of the region where the pixel electrode 330 and the common electrode 340 protrude in opposite directions. The first insulating layer 510 may protect the overlapped portions of the pixel electrode 330 and the common electrode 340 and electrically insulate them. Further, the first insulating layer 510 may prevent (or substantially prevent) a first semiconductor layer 351 and a second semiconductor layer 352 of the light emitting element 350 from directly contacting other members, thereby preventing damage to the light emitting element 350.

FIG. 3 illustrates an embodiment in which the contact surfaces between the first insulating layer 510 and the pixel electrode 330 and between the first insulating layer 510 and the common electrode 340 are aligned with side surfaces of the light emitting element 350. However, the present disclosure is not limited thereto. For example, if the length of the first insulating layer 510 is longer than the length of the light emitting element 350, the first insulating layer 510 may protrude from (or beyond) both sides of the light emitting element 350. Accordingly, the first insulating layer 510 and the light emitting element 350 may be stacked such that their side surfaces become stepped.

At least one light emitting element 350 may be disposed between the pixel electrode 330 and the common electrode 340. FIG. 1 illustrates an embodiment in which light emitting elements 350 that emit light of the same color are disposed in each pixel PX. However, the present disclosure is not limited thereto, and as described above, the light emitting elements 350 emitting light of different colors may be disposed together in one pixel PX.

The pixel electrode 330 and the common electrode 340 are spaced apart by a distance (e.g., a predetermined distance), and the distance may be equal to or smaller than the length of the light emitting element 350. Accordingly, electrical contact between the pixel electrode 330 and the light emitting element 350 and between the common electrode 340 and the light emitting element 350 may be ensured.

The light emitting element 350 may be a light emitting diode. The light emitting element 350 may be a nanostructure having, generally, a size in nano-units. The light emitting element 350 may be an inorganic light emitting diode including (or made of) an inorganic material. When the light emitting element 350 is an inorganic light emitting diode, a light emitting material having an inorganic crystal structure is disposed between two electrodes facing each other, and an electric field is formed in a direction (e.g., a specific direction) in the light emitting material. The inorganic light emitting diode may be aligned between the two electrodes having a specific polarity. A detailed description thereof will be described below.

A second insulating layer 520 may be disposed on the light emitting element 350 to protect the light emitting element 350 and fix the light emitting element 350 between the pixel electrode 330 and the common electrode 340. The second insulating layer 520 may be disposed on the outer surface of the light emitting element 350 to fix the light emitting element 350. The second insulating layer 520 may be disposed on a portion of the outer surface of the light emitting element 350 but may be arranged such that both side surfaces of the light emitting element 350 are exposed.

For example, because the length of the second insulating layer 520 is shorter than the length of the light emitting element 350, the second insulating layer 520 may be recessed inward from both side surfaces of the light emitting element 350. Accordingly, the first insulating layer 510, the light emitting element 350, and the second insulating layer 520 may be stacked such that their side surfaces are stepped. In this embodiment, similar to the first insulating layer 510, by providing the second insulating layer 520 to expose both side surface of the light emitting element 350, the first contact electrode 360 and the second contact electrode 370 may smoothly contact the side surfaces of the light emitting element 350.

However, the present disclosure is not limited thereto. The second insulating layer 520 and the light emitting element 350 may have the same length, and both sides thereof may be aligned. In addition, when the second insulating layer 520 is patterned concurrently (or simultaneously) with the first insulating layer 510, both sides of the second insulating layer 520 may be aligned with both sides of each of the light emitting element 350 and the first insulating layer 510.

The first contact electrode 360, which is disposed on the pixel electrode 330, may be provided on the second insulating layer 520 to overlap at least a portion of the second insulating layer 520, and the second contact electrode 370, which is disposed on the common electrode 340, may be provided on the second insulating layer 520 to contact at least a portion of the second insulating layer 520 while being spaced apart from the first contact electrode 360.

The first contact electrode 360 and the second contact electrode 370 may be disposed on the top surfaces of the pixel electrode 330 and the common electrode 340, respectively. For example, the first contact electrode 360 and the second contact electrode 370 may contact the first partition electrode layer 332 and the second partition electrode layer 342 on the top surfaces of the pixel electrode 330 and the common electrode 340, respectively. The first contact electrode 360 and the second contact electrode 370 may contact the first semiconductor layer 351 and the second semiconductor layer 352 of the light emitting element 350, respectively. Accordingly, the first contact electrode 360 and the second contact electrode 370 may transmit an electrical signal applied to the first partition electrode layer 332 and the second partition electrode layer 342 to the light emitting element 350.

The first contact electrode 360 is disposed on the pixel electrode 330 to cover the pixel electrode 330, and the bottom surface thereof may partially contact the light emitting element 350 and the second insulating layer 520. One end of the first contact electrode 360 in a direction toward the common electrode 340 is disposed on the second insulating layer 520. The second contact electrode 370 is disposed on the common electrode 340 to cover the common electrode 340, and the bottom surface thereof may partially contact the light emitting element 350, the second insulating layer 520, and a third insulating layer 530. One end of the second contact electrode 370 in a direction toward the pixel electrode 330 is disposed on the third insulating layer 530.

The first contact electrode 360 and the second contact electrode 370 may be disposed spaced apart from each other on the second insulating layer 520 or the third insulating layer 530. For example, the first contact electrode 360 and the second contact electrode 370 contact the light emitting element 350 and the second insulating layer 520 or the third insulating layer 530 but are spaced apart from each other on the second insulating layer 520. Thus, the first contact electrode 360 and the second contact electrode 370 may not be connected to (or may not contact) each other. Accordingly, the first contact electrode 360 and the second contact electrode 370 may receive different powers (or voltages) from the first thin film transistor 120 and the power wiring 161. For example, the first contact electrode 360 may receive a driving voltage applied from the first thin film transistor 120 to the pixel electrode 330, and the second contact electrode 370 may receive a power voltage applied from the power wiring 161 to the common electrode 340. However, the present disclosure is not limited thereto.

The first contact electrode 360 and the second contact electrode 370 may include a conductive material. For example, they may include ITO, IZO, ITZO, aluminum (Al), or the like. However, the present disclosure is not limited thereto.

In addition, the first contact electrode 360 and the second contact electrode 370 may include the same material as the first partition electrode layer 332 and the second partition electrode layer 342. The first contact electrode 360 and the second contact electrode 370 may be arranged in substantially the same pattern on the first partition electrode layer 332 and the second partition electrode layer 342 to contact the first partition electrode layer 332 and the second partition electrode layer 342. The first contact electrode 360 and the second contact electrode 370, which contact the first partition electrode layer 332 and the second partition electrode layer 342, may receive an electrical signal applied to the first partition electrode layer 332 and the second partition electrode layer 342 and transfer the electrical signal to the light emitting element 350.

The third insulating layer 530 may be disposed on the first contact electrode 360 to electrically insulate the first contact electrode 360 from the second contact electrode 370. The third insulating layer 530 may be disposed to cover the first contact electrode 360 but to not overlap a portion of the light emitting element 350 so that the light emitting element 350 is connected to the second contact electrode 370. The third insulating layer 530 may partially contact the first contact electrode 360 and the second insulating layer 520 on the top surface of the second insulating layer 520. The third insulating layer 530 may be disposed to cover one end of the first contact electrode 360 on the top surface of the second insulating layer 520. Accordingly, the third insulating layer 530 may protect the first contact electrode 360 and electrically insulate the first contact electrode 360 from the second contact electrode 370.

One end of the third insulating layer 530 in a direction toward the common electrode 340 may be aligned with one side of the second insulating layer 520.

In some embodiments, the third insulating layer 530 may be omitted from the display device 10. In such embodiments, the first contact electrode 360 and the second contact electrode 370 may be disposed on substantially the same plane and may be electrically insulated from each other by a passivation layer 550, to be described in more detail below.

The passivation layer 550 may be formed on the third insulating layer 530 and the second contact electrode 370 to protect members disposed on the insulating substrate layer 310 against the external environment. When the first contact electrode 360 and the second contact electrode 370 are exposed, a problem of disconnection of the contact electrode material may occur due to electrode damage and covering them with the passivation layer 550 may help prevent disconnection. For example, the passivation layer 550 may be disposed to cover the pixel electrode 330, the common electrode 340, the light emitting element 350, and the like. In addition, as described above, when the third insulating layer 530 is omitted, the passivation layer 550 may be formed on the first contact electrode 360 and the second contact electrode 370. In such an embodiment, the passivation layer 550 may electrically insulate the first contact electrode 360 and the second contact electrode 370 from each other.

Each of the above-described first insulating layer 510, second insulating layer 520, third insulating layer 530, and passivation layer 550 may include an inorganic insulating material. For example, the first insulating layer 510, the second insulating layer 520, the third insulating layer 530, and the passivation layer 550 may include a material, such as silicon oxide ($SiO_x$), silicon nitride ($SiN_x$), silicon oxynitride ($SiO_xN_y$), aluminum oxide ($Al_2O_3$), aluminum nitride (AlN), and the like. The first insulating layer 510, the second insulating layer 520, the third insulating layer 530, and the passivation layer 550 may be made of the same material but may be made of different materials. In addition, various suitable materials that impart insulating properties to the first insulating layer 510, the second insulating layer 520, the third insulating layer 530, and the passivation layer 550 may be used.

As described above, the display device 10 according to an embodiment may include the pixel electrode 330, the common electrode 340, and the light emitting element 350 disposed between the pixel electrode 330 and the common electrode 340. The light emitting element 350 may receive an electrical signal from the first contact electrode 360 and the second contact electrode 370 to emit light of a specific wavelength.

The light emitting element 350 may be manufactured on a substrate by epitaxial growth. A seed crystal layer for forming a semiconductor layer may be formed on the substrate, and a desired semiconductor material may be deposited to grow. Hereinafter, the structure of the light emitting element 350 according to various embodiments will be described in detail with reference to FIGS. 4 to 6.

Figure 4:
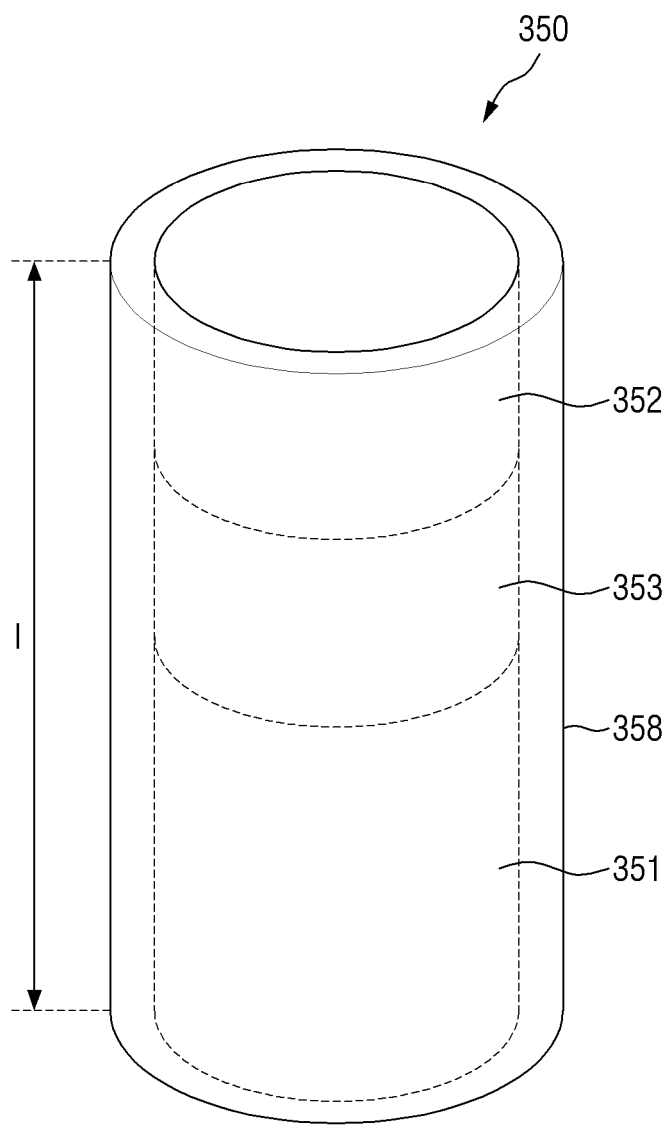
FIGS. 4 to 6 are schematic diagrams of light emitting elements according to embodiments.

FIG. 4 is a schematic diagram of a light emitting element according to an embodiment.

Referring to FIG. 4, the light emitting element 350 may include the plurality of semiconductor layers 351 and 352 and an active material layer 353 disposed between the plurality of semiconductor layers 351 and 352. An electrical signal applied from the pixel electrode 330 and the common electrode 340 may be transmitted to the active material layer 353 through the plurality of semiconductor layers 351 and 352 so that light is emitted.

The light emitting element 350 may include the first semiconductor layer 351, the second semiconductor layer 352, the active material layer 353 disposed between the first semiconductor layer 351 and the second semiconductor layer 352, and an insulating material layer 358. The light emitting element 350 shown in FIG. 4 illustrates a structure in which the first semiconductor layer 351, the active material layer 353, and the second semiconductor layer 352 are sequentially stacked in the longitudinal direction.

The first semiconductor layer 351 may be an n-type semiconductor layer. As one example, when the light emitting element 350 emits light in a blue wavelength band, the first semiconductor layer 351 may include a semiconductor material having a chemical formula of $In_xAl_yGa_{1-x-y}N$ ($0 \leq x \leq 1$, $0 \leq y \leq 1$, $0 \leq x+y \leq 1$). For example, the semiconductor material may be any one or more of n-type doped InAlGaN, GaN, AlGaN, InGaN, AlN and InN. The first semiconductor layer 351 may be doped with a first conductive dopant. For example, the first conductive dopant may be Si, Ge, Sn, or the like. The length of the first semiconductor layer 351 may be in a range of 1.5 µm to 5 µm but is not limited thereto.

The second semiconductor layer 352 may be a p-type semiconductor layer. As one example, when the light emitting element 350 emits light in a blue wavelength band, the second semiconductor layer 352 may include a semiconductor material having a chemical formula of $In_xAl_yGa_{1-x-y}N$ ($0 \le x \le 1$, $0 \le y \le 1$, $0 \le x+y \le 1$). For example, the semiconductor material may be any one or more of p-type doped InAlGaN, GaN, AlGaN, InGaN, AlN and InN. The second semiconductor layer 352 may be doped with a second conductive dopant. For example, the second conductive dopant may be Mg, Zn, Ca, Se, Ba, or the like. The length of the second semiconductor layer 352 may be in a range of 0.08 µm to 0.25 µm but is not limited thereto.

The active material layer 353 is disposed between the first semiconductor layer 351 and the second semiconductor layer 352 and may include a material having a single or multiple quantum well structure. When the active material layer 353 includes a material having a multiple quantum well structure, a plurality of quantum layers and well layers may be alternately stacked. The active material layer 353 may emit light by coupling of electron-hole pairs according to an electric signal applied through the first semiconductor layer 351 and the second semiconductor layer 352. For example, when the active material layer 353 emits light in a blue wavelength band, the active material layer 353 may include a material, such as AlGaN or AlInGaN. When the active material layer 353 has a multiple quantum well structure in which quantum layers and well layers are alternately stacked, the quantum layer may include a material, such as AlGaN or AlInGaN, and the well layer may include a material, such as GaN or AlGaN. However, the present disclosure is not limited thereto, and the active material layer 353 may have a structure in which semiconductor materials having large band gap energy and semiconductor materials having small band gap energy are alternately stacked and may include other Group III to V semiconductor materials according to the wavelength band of the emitted light. The light emitted by the active material layer 353 is not limited to light in a blue wavelength band but may also emit light in a red or green wavelength band in some embodiments. The length of the active material layer 353 may be in a range of 0.05 µm to 0.25 µm but is not limited thereto.

The light emitted from the active material layer 353 may be emitted toward both side surfaces as well as the outer surface of the light emitting element 350 in a longitudinal direction. The directionality of light emitted from the active material layer 353 is not limited to one direction.

The insulating material layer 358 may be formed on an outer surface of the light emitting element 350 to protect the light emitting element 350. For example, the insulating material layer 358 is formed to surround the side surface (e.g., a peripheral surface) of the light emitting element 350 but may not be formed at opposite ends of the light emitting element 350 in the longitudinal direction (e.g., at ends where the first semiconductor layer 351 and the second semiconductor layer 352 are disposed). However, the present disclosure is not limited thereto. The insulating material layer 358 may include materials having insulating properties, for example, silicon oxide ($SiO_x$), silicon nitride ($SiN_x$), silicon oxynitride ($SiO_xN_y$), aluminum nitride (AlN), aluminum oxide ($A_2O_3$), and the like. Accordingly, an electrical short circuit that may occur when the active material layer 353 directly contacts the pixel electrode 330 or the common electrode 340 can be prevented. In addition, because the insulating material layer 358 protects the outer surface of the light emitting element 350, including the active material layer 353, it is possible to prevent or substantially prevent a decrease in luminous efficiency.

Further, in some embodiments, the insulating material layer 358 may be surface-treated to be dispersed without aggregation with other insulating material layers 358 in a solution. When aligning the light emitting elements 350, which will be described in more detail below, the light emitting elements 350 in the solution may be maintained in a dispersed state and may be independently aligned between the pixel electrode 330 and the common electrode 340. For example, the insulating material layer 358 may be subjected to a hydrophobic surface treatment or a hydrophilic surface treatment to maintain a mutually dispersed state in the solution.

The thickness of the insulating material layer 358 may be in a range of 0.5 µm to 1.5 µm but is not limited thereto.

The light emitting element 350 may have a cylindrical shape. However, the shape of the light emitting element 350 is not limited thereto, and the light emitting element 350 may have various shapes, such as a regular cube, a rectangular parallelepiped, and a hexagonal prism. The light emitting element 350 may have a length l in a range of 1 µm to 10 µm, in a range of 2 µm to 5 µm, or about 4 µm. In addition, the diameter of the light emitting element 350 may be in a range of 400 nm to 700 nm and, in some embodiments, may be about 500 nm.

Figure 5:
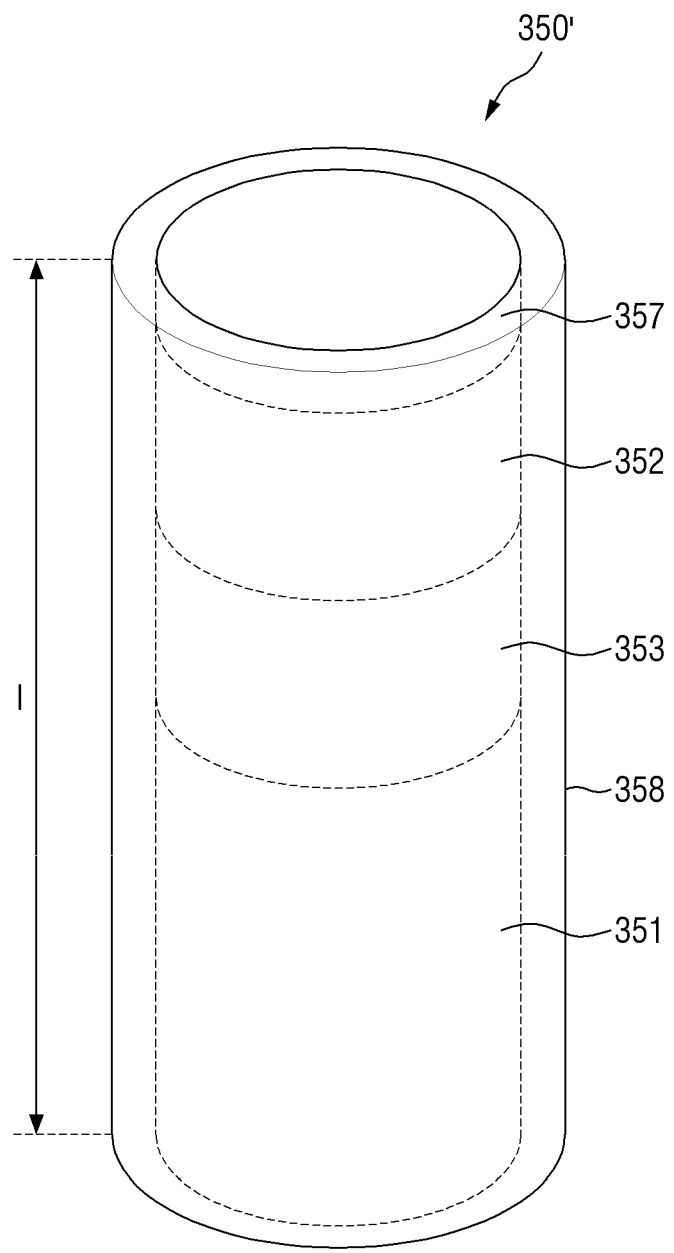
Figure 6:
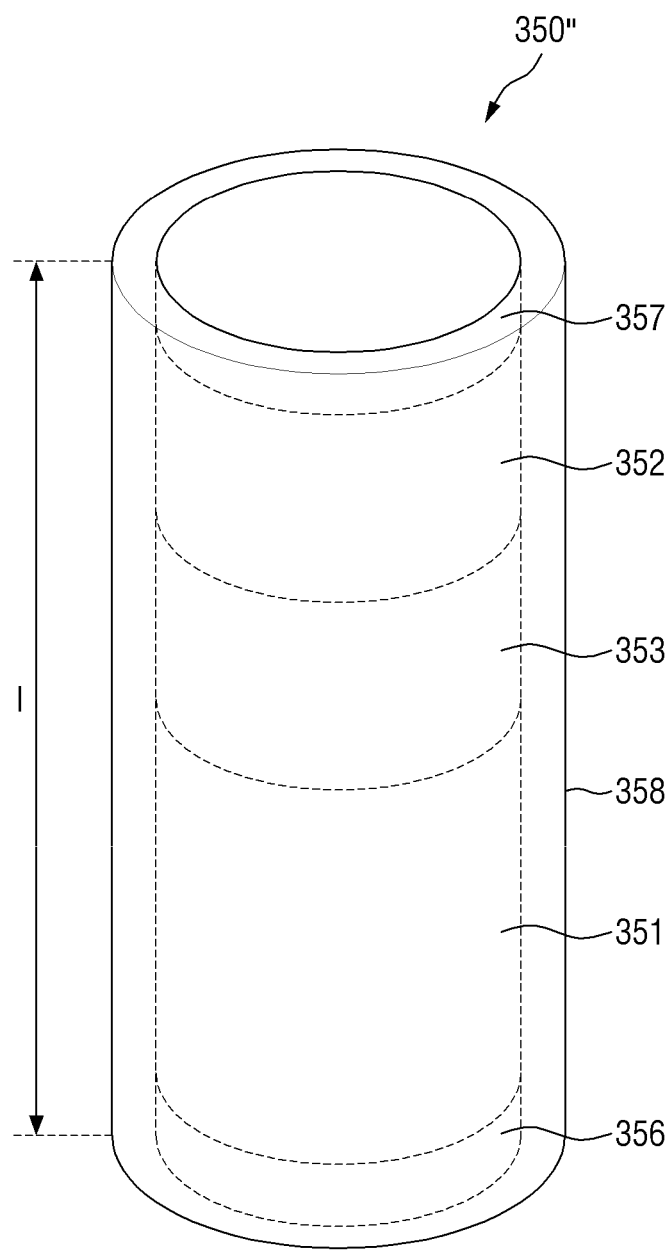

FIGS. 5 and 6 are schematic views showing light emitting elements according to other embodiments.

Referring to FIGS. 5 and 6, light emitting elements 350' and 350" may further include an electrode layer 356, 357 provided on at least one of the sides thereof where the first semiconductor layer 351 and the second semiconductor layer 352 are disposed.

FIG. 5 illustrates an embodiment in which the light emitting element 350' further includes the electrode layer 357 provided on the second semiconductor layer 352. FIG. 6 illustrates an embodiment in which the light emitting element 350" includes the electrode layers 356 and 357 respectively provided on the first semiconductor layer 351 and the second semiconductor layer 352. For simplicity of description, an electrode layer formed on one side at where the first semiconductor layer 351 is provided is referred to as a first electrode layer 356, and an electrode layer formed on the other side at where the second semiconductor layer 352 is provided is referred to as a second electrode layer 357. However, the present disclosure is not limited thereto, and any electrode layer may be referred to as a first electrode layer.

The light emitting elements 350' and 350" according to other embodiments may include at least one of the first electrode layer 356 or the second electrode layer 357. In these embodiments, the insulating material layer 358 may extend in the longitudinal direction to cover the first electrode layer 356 and the second electrode layer 357. However, the present disclosure is not limited thereto, and the insulating material layer 358 may cover only the first semiconductor layer 351, the active material layer 353, and the second semiconductor layer 352 or may cover only a portion of the outer surfaces of the electrode layers 356 and 357 so that the outer surfaces of the first electrode layer 356 and second electrode layer 357 are partially exposed.

The first electrode layer 356 and the second electrode layer 357 may be ohmic contact electrodes. However, the present disclosure is not limited thereto, and the first electrode layer 356 and the second electrode layer 357 may be Schottky contact electrodes. The first electrode layer 356 and the second electrode layer 357 may include conductive metal. For example, the first electrode layer 356 and the second electrode layer 357 may include at least one of aluminum (Al), titanium (Ti), indium (In), gold (Au), or silver (Ag). The first electrode layer 356 and the second electrode layer 357 may include the same material or different materials. However, the present disclosure is not limited thereto.

Referring back to FIG. 1, in the case of the wirings (e.g., the first pixel stem wiring 410a and the common stem wiring 450a) disposed in the non-light emitting portion NLA and relatively adjacent to the light emitting portion LA, the first pixel branch wiring 410b and the common branch wiring 450b are respectively branched from these stem wirings and extend to each pixel PX may be connected in substantially the same layer. This is because no other members or wirings are disposed in paths where the first pixel branch wiring 410b and the common branch wiring 450b extend to the pixel PX.

In the case of the wirings (e.g., the second pixel stem wiring 420a and the third pixel stem wiring 430a) disposed relatively far from the light emitting portion LA, the second pixel branch wiring 420b and the third pixel branch wiring 430b branched from the stem wirings and extending to each pixel PX may be blocked on their ways to the pixel PX by the first pixel stem wiring 410a and the common stem wiring 450a, respectively. In order to secure the paths of these branch wirings, the path structure of the stem wirings and the branch wirings may be variously formed on the same layer, but in such embodiments, the arrangement of the wirings may be complicated and crosstalk may occur.

Accordingly, the display device 10 according to an embodiment may include different wiring layers, for example, a first wiring layer ACL1 and a second wiring layer ACL2 in a portion of the light emitting portion LA and the non-light emitting portion NLA. The display device 10 may further include bridge wirings 415 and 425 that are disposed in the second wiring layer ACL2 and are electrically connected to at least one of the wirings 400 arranged in the first wiring layer ACL1. The bridge wirings 415 and 425 disposed in the second wiring layer ACL2 may be electrically connected to the branch wirings, for example, to the second pixel branch wiring 420b and the third pixel branch wiring 430b, which are branched from the stem wirings that are disposed relatively far from the light emitting portion LA, in the first wiring layer ACL1. A detailed description thereof will be given with reference to FIG. 7.

Figure 7:
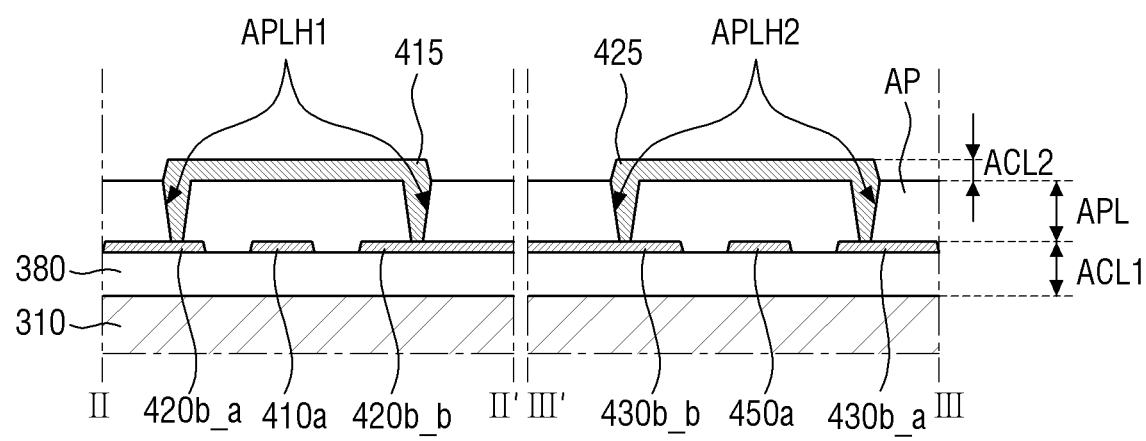
FIG. 7 is a cross-sectional view of bridge wirings taken along the lines II-II' and III-III' of FIG. 1.

FIG. 7 is a cross-sectional view taken along the lines II-II' and of FIG. 1. FIG. 7 is a cross-sectional view showing a structure of a region including the bridge wirings 415 and 425 in the non-light emitting portion NLA of the display device 10.

Referring to FIG. 7, the display device 10 includes the first wiring layer ACL1 disposed on the insulating substrate layer 310. The plurality of partition walls 380, the common wiring 450, and the pixel wirings 410, 420, and 430 may be disposed in the first wiring layer ACL1. The common branch wiring 450b and the pixel branch wirings 410b, 420b, and 430b may be disposed and the light emitting elements 350 may be aligned therebetween. In addition, electrodes 330 and 340, contact electrodes 360 and 370, and the like, which are members included in the display device 10 described above with reference to FIG. 3 may be disposed.

The partition walls 380 may be disposed in the first wiring layer ACL1. In FIG. 7, the partition walls 380 are connected to form a single layer (e.g., a continuous layer). However, in some embodiments, the partition walls 380 may be disposed spaced apart from each other (e.g., in an island arrangement). The shape, arrangement structure, and function of the partition walls 380 are the same as described above with reference to FIG. 3. A detailed description thereof will be omitted. However, in some embodiments, the partition wall 380 may be omitted. In such an embodiment, the plurality of wirings 400 disposed in the first wiring layer ACL1 may be directly disposed on the insulating substrate layer 310.

The plurality of wirings 400, for example, the common wiring 450 and the pixel wirings 410, 420 and 430, may be disposed on the partition wall 380. FIG. 7 only shows wirings arranged along the line II-II' and the line III'-III of FIG. 1. In a region overlapping the non-light emitting portion NLA, because the light emitting elements 350 are not arranged therein, a plurality of wirings, such as the common stem wiring 450a, the pixel stem wirings 410a, 420a, 430a, and some of the pixel branch wirings 410b, 420b, and 430b, may be disposed. On the partition wall 380, the first pixel stem wiring 410a, the common stem wiring 450a, and the second pixel branch wiring 420b and third pixel branch wiring 430b whose paths toward the pixel PX are blocked by the first pixel stem wiring 410a and common stem wiring 450a, may be disposed.

The path of the second pixel branch wiring 420b is blocked by the first pixel stem wiring 410a so that the second pixel branch wiring 420b may be partially divided and arranged on the partition wall 380. For example, the second pixel branch wiring 420b may include a base branch pattern 420b_a connected to the second pixel stem wiring 420a and a separate branch pattern 420b_b spaced apart from the base branch pattern 420b_a, which may be respectively disposed on the partition wall 380. The base branch pattern 420b_a and the separate branch pattern 420b_b may be aligned in an extending direction of the second pixel branch wiring 420b. In addition, the path of the third pixel branch wiring 430b is blocked by the common stem wiring 450a, so that the third pixel branch wiring 430b may be divided into, for example, a base branch pattern 430b_a and a separate branch pattern 430b_b arranged on the partition wall 380. The second pixel branch wiring 420b and the third pixel branch wiring 430b are patterned to be divided in the first wiring layer ACL1. The first wiring layer ACL1 and the second wiring layer ACL2, to be described in more detail below, may be provided with the plurality of wirings 400, and accordingly, they may be considered as a conductive layer, a conductive pattern, and the like but are not limited thereto.

An insulating film layer APL is disposed on the first wiring layer ACL1. The insulating film layer APL includes an insulating material film AP having a plurality of wiring contact openings (e.g., wiring contact holes) APLH through which the first wiring layer ACL1 and the second wiring layer ACL2 are connected. The insulating material film AP may cover the wirings 400, for example, the common wiring 450 and the pixel wirings 410, 420, and 430, disposed in the first wiring layer ACL1 to protect the wirings 400 and to electrically insulate the wirings that are not electrically connected to the bridge wirings 415 and 425. The insulating material film AP may include inorganic or organic insulating material. For example, the insulating material film AP may be silicon oxide ($SiO_x$), silicon nitride ($SiN_x$), silicon acid-nitride ($SiO_xN_y$), polyimide (PI), or the like but is not limited thereto.

The wiring contact openings APLH may expose some of the wirings disposed in the first wiring layer ACL1 to the outside (e.g., through the insulating material film AP). For example, the wiring contact openings APLH may expose the base branch patterns 420b_a and 430b_a and the separate branch patterns 420b_b and 430b_b. In addition, the wiring contact openings APLH may provide a path through which the bridge wirings 415 and 425 of the second wiring layer ACL2 are connected to the base branch patterns 420b_a and 430b_a and the separate branch patterns 420b_b and 430b_b, which are partial wirings in the first wiring layer ACL1, are connected. In FIG. 7, a first wiring contact opening APLH1 and a second wiring contact opening APLH2 each include two openings (e.g., holes). However, the present disclosure is not limited thereto, and in some embodiments, the first wiring contact opening APLH1 and the second wiring contact opening APLH2 may each include one opening. A detailed description thereof will be provided below.

The insulating material film AP may cover the wirings in the first wiring layer ACL1, and the top surface thereof may be planarized. Accordingly, a step that may be caused by the wirings of the first wiring layer ACL1 may be minimized or eliminated, and the bridge wirings 415 and 425 may be disposed on the planarized surface of the insulating material film AP. However, the present disclosure is not limited thereto. In some embodiments, the insulating material film AP may be stacked in substantially the same manner as the structure of the partition wall 380, the common wiring 450, or the pixel wirings 410, 420, and 430 of the first wiring layer ACL1 so that the top surface may not be flat.

The second wiring layer ACL2 is disposed on the insulating film layer APL, and the bridge wirings 415 and 425 are disposed in the second wiring layer ACL2. The bridge wirings 415 and 425 may be respectively connected to wirings of the first wiring layer ACL1, for example, to the base branch patterns 420b_a and 430b_a and the separate branch patterns 420b_b and 430b_b through the wiring contact openings ALPH in the insulating film layer APL. The base branch pattern 420b_a and the separate branch pattern 420b_b of the second pixel branch wiring 420b, which are spaced apart from each other with the first pixel stem wiring 410a therebetween in the first wiring layer APL1, may be electrically connected to a first bridge wiring 415 through the first wiring contact opening APLH1. In addition, the base branch pattern 430b_a and the separate branch pattern 430b_b of the third pixel branch wiring 430b, which are spaced apart from each other with the common stem wiring 450a therebetween, may be electrically connected to a second bridge wiring 425 through the second wiring contact opening APLH2.

Referring back to FIG. 1 together with FIG. 7, the common branch wiring 450b and the first pixel branch wiring 410b may be electrically connected on substantially the same plane in the first wiring layer ACL1. As described above, the paths of the common branch wiring 450b and the first pixel branch wiring 410b are not blocked.

On the other hand, the second pixel branch wiring 420b and the third pixel branch wiring 430b may be blocked along a path to the pixel PX by the first pixel stem wiring 410a and the common stem wiring 450a, respectively. The blocked paths may be overcome by electrically connecting these lines to each other through the bridge wirings 415 and 425, for example, the first bridge wiring 415 and the second bridge wiring 425, disposed in the second wiring layer ACL2, respectively. The second pixel branch wiring 420b and the third pixel branch wiring 430b are each partially separated into the base branch pattern 420b_a, 430b_a and the separate branch pattern 420b_b, 430b_b and disposed in the pixel PX. The separated portions may be electrically connected to each other through the first bridge wiring 415 and the second bridge wiring 425, respectively. Accordingly, the display device 10 according to an embodiment includes two different wiring layers ACL1 and ACL2 and bridge wirings 415 and 425 in some areas of the non-light emitting portion NLA and the light emitting portion LA, and thus, a different alignment signal may be applied to each pixel PX through the plurality of wirings 400.

However, the structure of the bridge wirings 415 and 425 and/or the structure of the wirings 400 disposed on the respective wiring layers ACL1 and ACL2 is not limited thereto. In some embodiments, some branch wirings may be arranged in the second wiring layer ACL2. A more detailed description thereof will be provided according to other embodiments to be described below.

The display device 10 according to an embodiment may include the plurality of wirings 400 that can apply a different alignment signal to each pixel PX. Further, in addition to at least one wiring layer ACL, the plurality of wirings 400 may be effectively disposed in the non-light emitting portion NLA, which is a relatively narrow region, through the above-described structure. Accordingly, different alignment signals may be applied to the plurality of wirings 400 to accurately align the light emitting elements 350 while preventing (or substantially preventing) mixing of the light emitting elements 350 between adjacent pixels PX.

Figure 8:
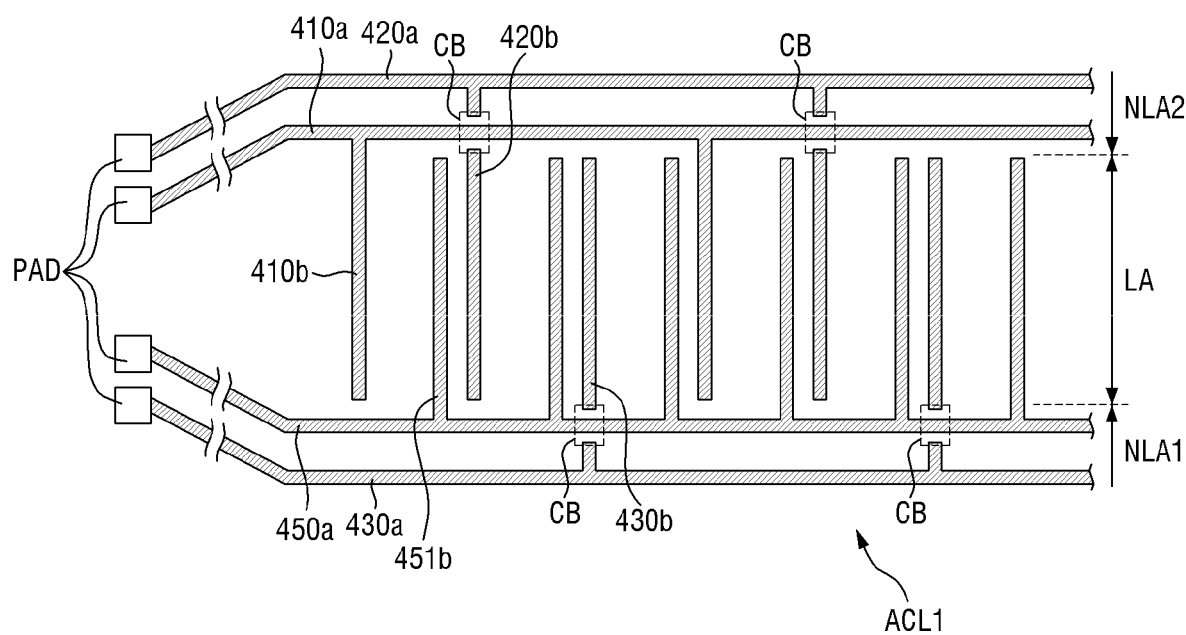
FIGS. 8 to 10 are schematic plan views illustrating some steps of a manufacturing method of a display device according to an embodiment.
Figure 9:
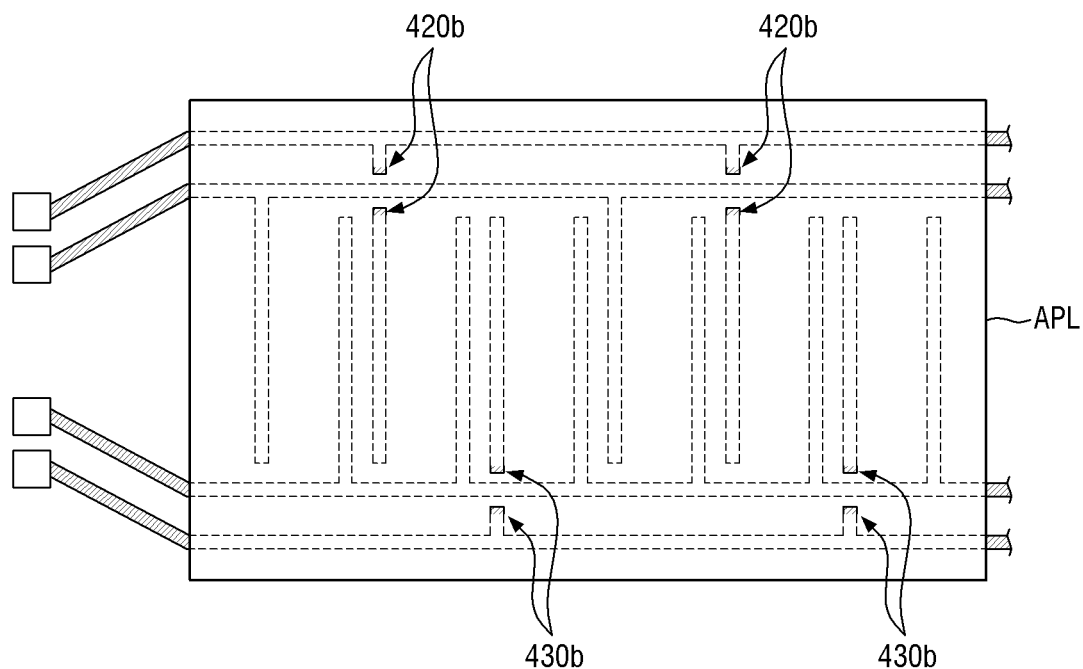
Figure 10:
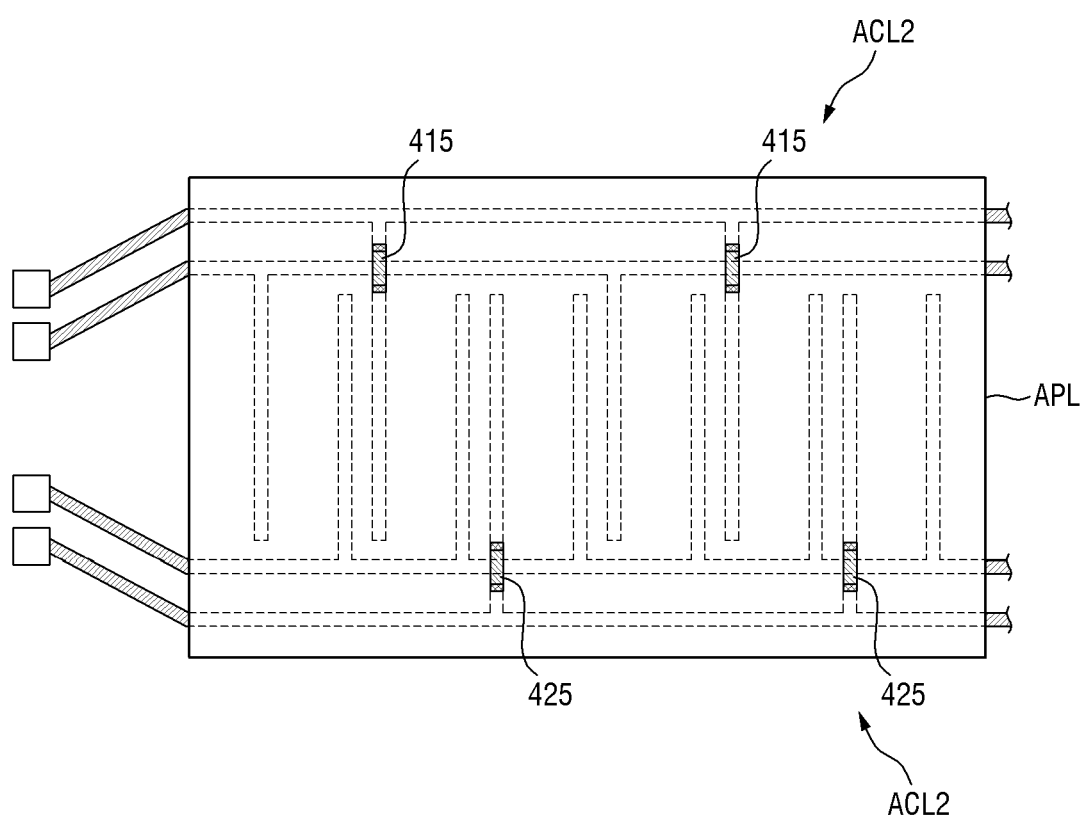

Hereinafter, a manufacturing method of the display device 10 according to an embodiment will be described with reference to FIGS. 8 to 10. In FIGS. 8 to 10, an arrangement structure of the plurality of wirings 400 and a formation of the bridge wirings 415 and 425 in the display device 10 will be described in more detail.

FIGS. 8 to 10 are schematic plan views illustrating some steps of a manufacturing method of a display device according to an embodiment. Hereinafter, this embodiment of the manufacturing method will be described with reference to the display device 10 described above with respect to FIGS. 1 and 7.

First, referring to FIG. 8, the first wiring layer ACL1 including the plurality of wirings 400 is formed on the insulating substrate layer 310. The plurality of wirings 400 may be formed by patterning a metal, an organic material, or the like by performing a mask process. For example, a first metal layer is deposited on the insulating substrate layer 310, and a photolithography process is performed to form the first wiring layer ACL1 including the plurality of wirings 400. In an embodiment, the plurality of wirings 400 may include the common wiring 450, the first pixel wiring 410, the second pixel wiring 420, and the third pixel wiring 430.

As described above, the display device 10 includes regions defined as the light emitting portion LA and the non-light emitting portion NLA. The common stem wiring 450a, the first pixel stem wiring 410a, the second pixel stem wiring 420a, and the third pixel stem wiring 430a are patterned to be spaced apart from each other in a region that overlaps the non-light emitting portion NLA of the insulating substrate layer 310. The common stem wiring 450a and the third pixel stem wiring 430a are disposed in the first non-light emitting portion NLA1, which is the non-light emitting portion NLA located under the light emitting portion LA. The first pixel stem wiring 410a and the second pixel stem wiring 420a are disposed in the second non-light emitting portion NLA2, which is the non-light emitting portion NLA located above the light emitting portion LA. In addition, the common stem wiring 450a and the first pixel stem wiring 410a are patterned to be disposed in an area relatively adjacent to the light emitting portion LA. The second pixel stem wiring 420a and the third pixel stem wiring 430a are patterned to be disposed in an area relatively far from the light emitting portion LA while being spaced apart from the first pixel stem wiring 410a and the common stem wiring 450a, respectively. A more detailed arrangement structure of the plurality of wirings 400, including an arrangement structure of the stem wirings, is the same as was described above with reference to FIG. 1, and thus, a detailed description thereof will not be repeated.

Branch wirings (e.g., the common branch wiring 450b, the first pixel branch wiring 410b, the second pixel branch wiring 420b, and the third pixel branch wiring 430b) branched from each stem wiring are patterned at a region that overlaps the light emitting portion LA of the insulating substrate layer 310. The second pixel branch wiring 420b and the third pixel branch wiring 430b, which are branched from the stem wirings disposed relatively far from the light emitting portion LA, are patterned such that some portions thereof are divided (e.g., are patterned into at least two separate parts or pieces). For example, as illustrated in FIG. 8, the second pixel branch wiring 420b and the third pixel branch wiring 430b are patterned to have at least one separation portion CB.

The second pixel branch wiring 420b and the third pixel branch wiring 430b are at least partially divided at the separation portions CB. Each separation portion CB may at least partially overlap other stem wirings, for example, the common stem wiring 450a or the first pixel stem wiring 410a. Because the second pixel branch wiring 420b and the third pixel branch wiring 430b are blocked along their path to the light emitting portion LA by the common stem wiring 450a or the first pixel stem wiring 410b, the separation portion CB is provided such that the second pixel branch wiring 420b and the third pixel branch wiring 430b do not contact the common stem wiring 450a and the first pixel stem wiring 410b. The second pixel branch wiring 420b and the third pixel branch wiring 430b may be electrically connected to the bridge wirings 415 and 425 in areas adjacent to the separation portions CB, as will be described in more detail later.

Next, referring to FIG. 9, the insulating film layer APL is formed on the first wiring layer ACL1. The insulating film layer APL includes the insulating material film AP and has the plurality of wiring contact openings APLH disposed in the insulating material film AP that expose a portion of pixel branch wirings, for example, the second pixel branch wiring 420b and the third pixel branch wiring 430b, adjacent to the plurality of separation portions CB.

The insulating material film AP is formed to cover the plurality of wirings 400 disposed in the first wiring layer ACL1 and a portion of the insulating substrate layer 310. Then, the insulating material layer AP is patterned to form the wiring contact openings APLH to partially expose the second pixel branch wiring 420b and the third pixel branch wiring 430b. A portion of the second pixel branch wiring 420b and a portion of the third pixel branch wiring 430b may be exposed to the outside through the wiring contact openings APLH. The wiring contact openings APLH are disposed in a region where the non-light emitting portion NLA and the insulating film layer APL of the display device 10 overlap each other. As will be described in more detail below, the second pixel branch wiring 420b and the third pixel branch wiring 430b are electrically connected by the bridge wirings 415 and 425 through the wiring contact openings APLH, respectively.

Referring to FIG. 10, the bridge wirings 415 and 425 are formed on the insulating film layer APL to electrically connect the divided pixel branch wirings, for example, the second pixel branch wiring 420b and the third pixel branch wiring 430b. The bridge wirings 415 and 425 may include substantially the same materials as the common wiring 450 and the pixel wiring 410, 420, 430. Therefore, the bridge wirings 415 and 425 may be patterned in the same manner as described with reference to FIG. 8.

The bridge wirings 415 and 425 may include the first bridge wiring 415 electrically connecting the second pixel branch wiring 420b and the second bridge wiring 425 electrically connecting the third pixel branch wiring 430b. However, the present disclosure is not limited thereto, and in some embodiments, the bridge wirings 415 and 425 may electrically connect the common branch wiring 450b or the pixel stem wiring 410a, 420a, 430a.

The first bridge wiring 415 and the second bridge wiring 425 may be connected to the pixel branch wiring through the wiring contact openings APLH in the insulating film layer APL. The first wiring contact opening APLH1 exposing a portion of the second pixel branch wiring 420b becomes a contact path for the first bridge wiring 415. The second wiring contact opening APLH2 exposing a portion of the third pixel branch wiring 430b becomes a contact path for the second bridge wiring 425. A more detailed description of the structure of the bridge wirings 415 and 425 and the pixel branch wiring is the same as described above with reference to FIG. 7.

Hereinafter, other embodiments of the present disclosure will be described. Other embodiments described with reference to other drawings illustrate a structure or arrangement relationship applicable to the plurality of wirings 400 provided in the display device 10.

A structure of the bridge wirings 415 and 425 according to other embodiments will be described with reference to FIGS. 11 to 16.

Figure 11:
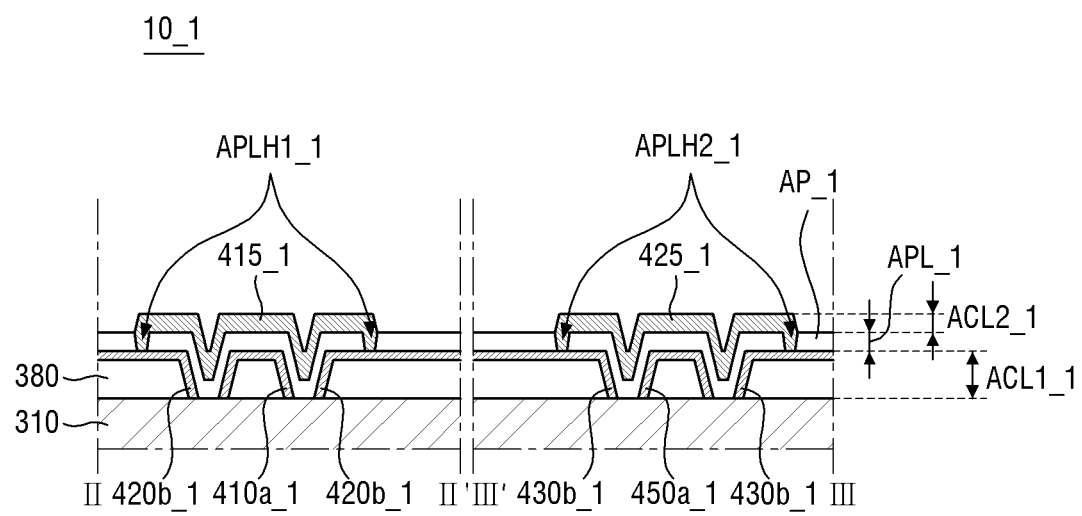
FIGS. 11 to 16 are cross-sectional and plan views illustrating bridge wirings according to embodiments.
Figure 12:
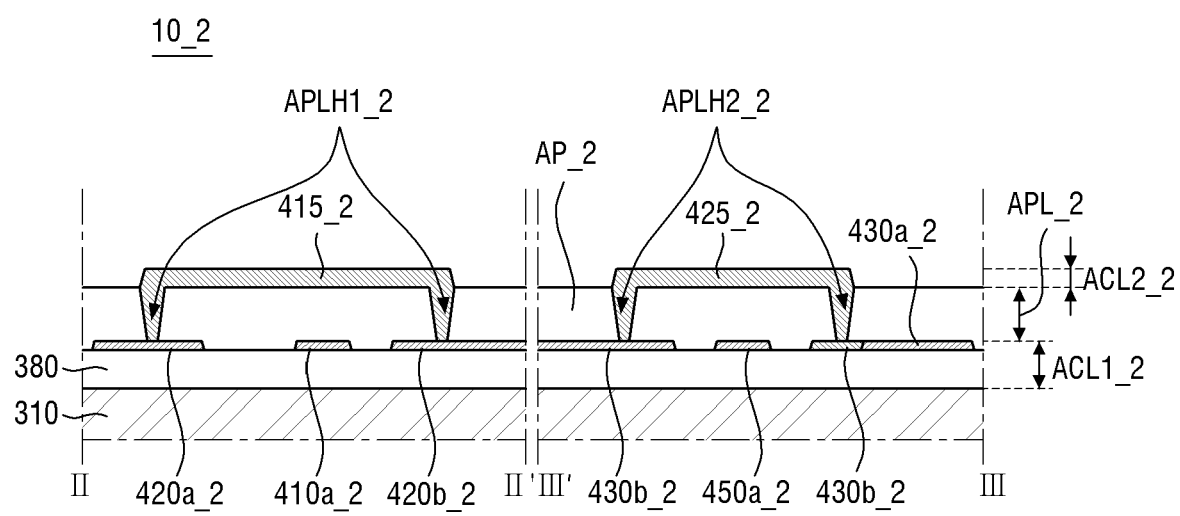
Figure 13:
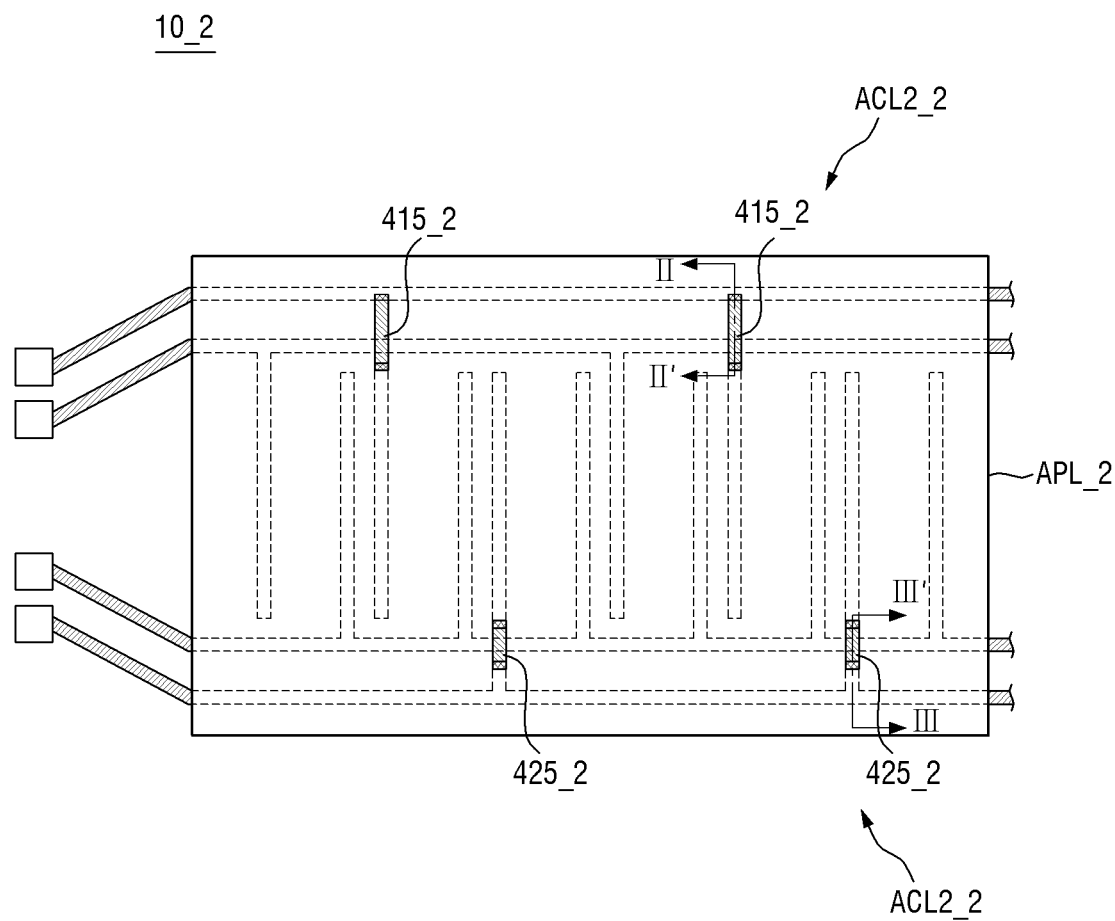
Figure 14:
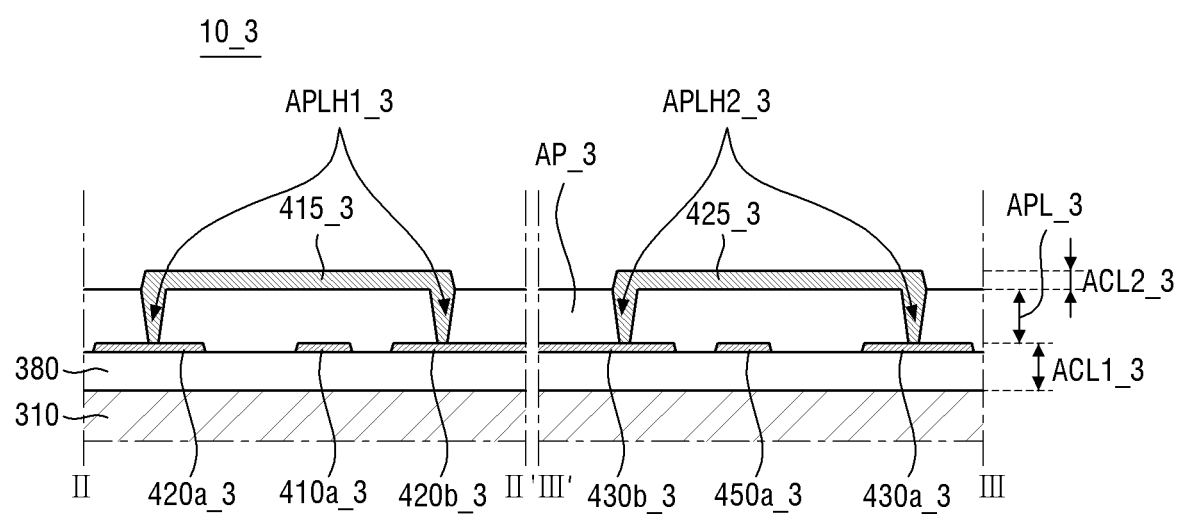
Figure 15:
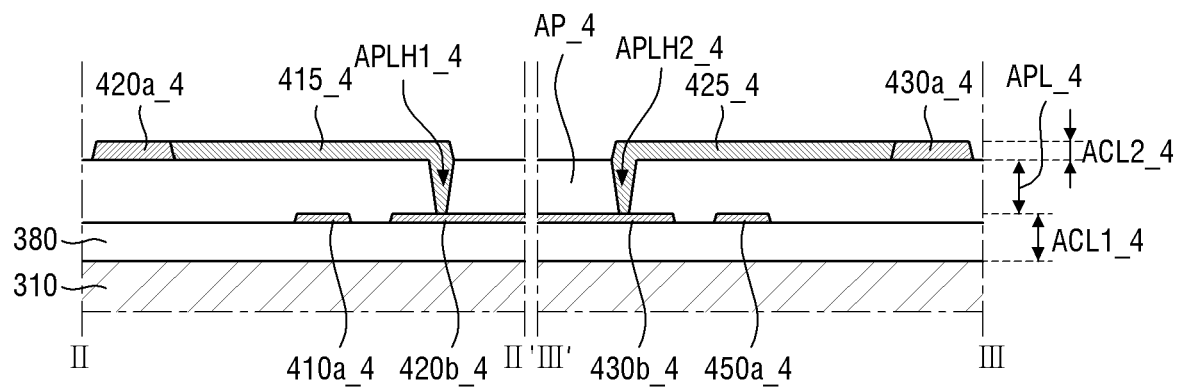
Figure 16:
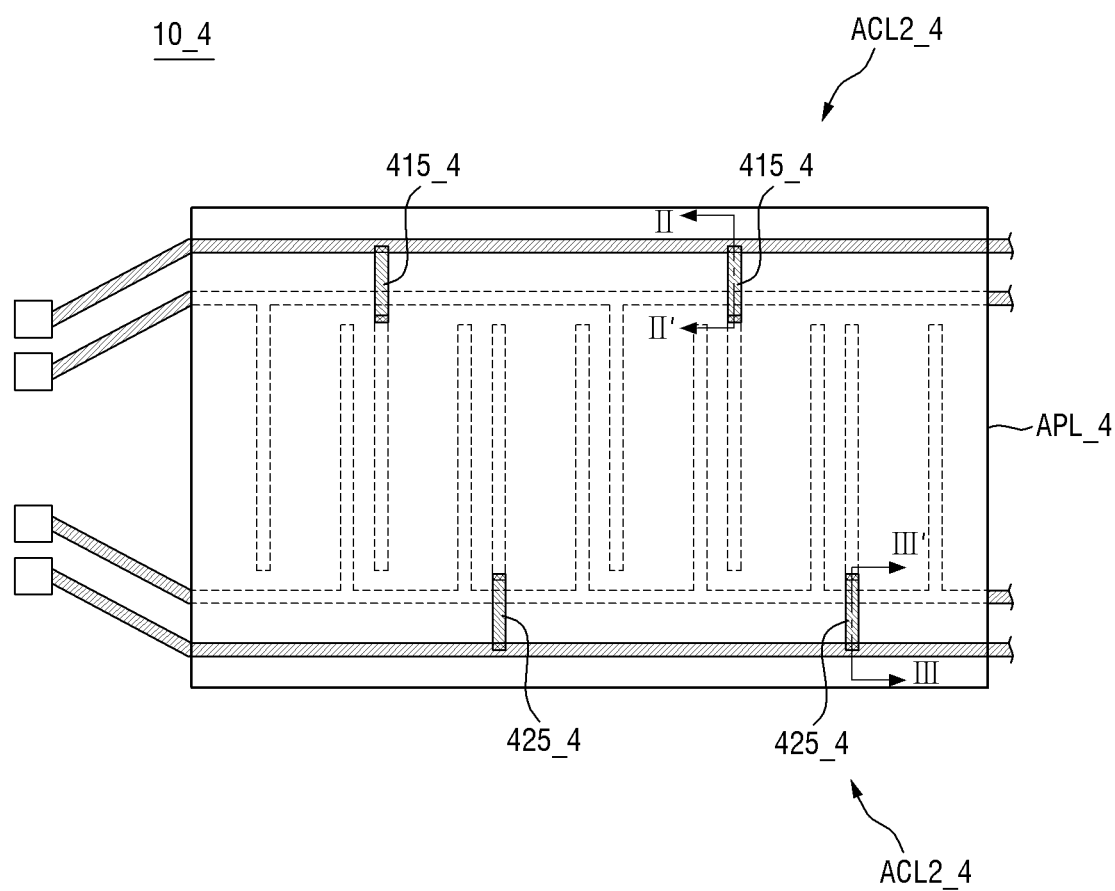

FIGS. 11, 12, 14, and 15 are cross-sectional and FIGS. 13 and 16 are plan views illustrating a connection structure of the bridge wiring and the pixel branch wiring according to other embodiments.

First, referring to FIG. 11, in a display device 10_1 shown in FIG. 11 showing cross sections taken along the lines II-II' and III-III' of FIG. 1, the plurality of partition walls 380 may be disposed spaced apart from each other on the insulating substrate layer 310. In addition, an insulating material film AP_1 of an insulating film layer APL_1 is formed in substantially the same shape as the partition wall 380 of the first wiring layer ACL1_1. Accordingly, because the insulating material film AP_1 is disposed while maintaining the step formed by the partition wall 380 of the first wiring layer ACL1_1, the top surface of the insulating material film AP_1 is not flat but has a curvature. The bridge wirings 415_1 and 425_1 disposed on the insulating material film AP_1 may also be bent according to the shape of the insulating material film AP_1 and may contact the insulating material film AP_1. The display device 10_1 shown in FIG. 11 is the same as the display device 10 shown in FIG. 7 except that the top surface of the insulating material film AP_1 is not flat. A further detailed description thereof will be omitted.

Next, referring to FIGS. 12 to 14, at least a portion of the bridge wiring 415, 425 may contact the pixel stem wiring, for example, the second pixel stem wiring 420a or the third pixel stem wiring 430a. For example, unlike the display device 10 shown in FIG. 7, the second pixel branch wiring 420b and the third pixel branch wiring 430b are not separated into the base branch pattern 420b_a, 430b_a and the separate branch pattern 420b_b, 430b_b. Instead, each of them may be divided into the separate branch pattern 420b_b, 430b_b and each pixel stem wiring. The second pixel branch wiring 420b and the third pixel branch wiring 430b disposed in the first wiring layer ACL1 may be understood as the separate branch patterns 420b_b and 430b_b, respectively.

In a display device 10_2 shown in FIGS. 12 and 13, a first bridge wiring 415_2 contacts a second pixel stem wiring 420a_2 and a second pixel branch wiring 420b_2 to electrically connect them. In a display device 10_3 shown in FIG. 14, a second bridge wiring 425_3 also contacts a third pixel stem wiring 430a_3 and a third pixel branch wiring 430b_3 to electrically connect them. The display devices 10_2 and 10_3 shown in FIGS. 12 and 14 are the same as the display device 10 shown in FIG. 7 except that the bridge wiring 415, 425 is connected to the pixel stem wiring 420a, 430a. Hereinafter, differences therebetween will be primarily described.

First, in the display device 10_2 shown in FIG. 12, the second pixel stem wiring 420a_2 may be directly connected to the first bridge wiring 415_2. Unlike the display device 10 shown in FIG. 7, the second pixel branch wiring 420b_2 extending in a second direction toward the pixels PX is not directly branched from the second pixel stem wiring 420a_2 but is disposed spaced apart from the second pixel stem wiring 420a_2.

Referring to FIG. 13, which is a plan view of the display device 10_2 shown in FIG. 12, the second pixel branch wiring 420b_2 is not branched from a portion of the second pixel stem wiring 420a_2 but disposed at the opposite side of the second pixel stem wiring 420a_2 with respect to the first pixel stem wiring 410a_2. In addition, the second pixel branch wiring 420b_2 and the second pixel stem wiring 420a_2 are electrically connected through the first bridge wiring 415_2 in a second wiring layer APL2_2.

A separation portion CB of the second pixel branch wiring 420b_2 disposed in the first wiring layer ACL1 may be formed to contact the second pixel stem wiring 420a_2. Accordingly, a portion of the second pixel stem wiring 420a_2 and the second pixel branch wiring 420b_2 may be exposed by a wiring contact opening APLH_2 in an insulating material film AP_2.

In addition, the second pixel branch wiring 420b_2 may be disposed only in the light emitting portion LA on a relatively inner side with respect to the first pixel stem wiring 410a_2. Because the portion that is directly branched and protrudes from the second pixel stem wiring 420a_2 is omitted, the second pixel branch wiring 420b_2 may be disposed spaced apart by a distance (e.g., a predetermined distance) from the second pixel stem wiring 420a_2. In addition, the first bridge wiring 415_2 may contact the second pixel stem wiring 420a_2 and the second pixel branch wiring 420b_2 through a first wiring contact opening APLH1_2 in the insulating material film AP2.

In the display device 10_3 shown in FIG. 14, a second pixel stem wiring 420a_3 and a third pixel stem wiring 430a_3 may be directly connected to a first bridge wiring 415_3 and a second bridge wiring 425_3, respectively. For example, a separation portion CB of the third pixel branch wiring 430b_3 may contact the third pixel stem wiring 430a_3, and a portion of the third pixel stem wiring 430a_3 may directly contact the second bridge wiring 425_3 through a second wiring contact opening APLH2_3. Otherwise, the display device 10_3 shown in FIG. 14 is the same as the display device 10_2 shown FIG. 12, and thus, a further detailed description thereof will be omitted.

Next, referring to FIGS. 15 and 16, in a display device 10_4, a second pixel stem wiring 420a_4 and a third pixel stem wiring 430a_4 may be disposed in a second wiring layer ACL2_4. A first bridge wiring 415_4 and a second bridge wiring 425_4 may contact a second pixel stem wiring 420a_4 and a third pixel stem wiring 430a_4 on substantially the same plane, respectively. Accordingly, a first wiring contact opening APLH1_4 and a second wiring contact opening APLH2_4 each have one opening (e.g., one hole) to expose a second pixel branch wiring 420b_4 and a third pixel branch wiring 430b_4 in a first wiring layer ACL1_4, respectively.

The second pixel stem wiring 420a_4 and the second pixel branch wiring 420b_4, which are in different wiring layers, may be electrically connected to each other through the first bridge wiring 415_4. The third pixel stem wiring 430a_4 and the third pixel branch wiring 430b_4, which are in different wiring layers, may also be electrically connected to each other through the second bridge wiring 425_4.

When forming the first wiring layer ACL1_4 in a manufacturing process of the display device 10_4, the second pixel stem wiring 420a_4 and the third pixel stem wiring 430a_4 are not patterned. The second pixel stem wiring 420a_4 and the third pixel stem wiring 430a_4 may be formed concurrently (or simultaneously) when the first bridge wiring 415_4 and the second bridge wiring 425_4 are patterned. In some embodiments, the second pixel stem wiring 420a_4 and the third pixel stem wiring 430a_4 may be patterned with substantially the same wiring as the first bridge wiring 415_4 and the second bridge wiring 425_4. Accordingly, stem wirings disposed in the non-light emitting portion NLA of the display device 10_4 may be respectively disposed in different wiring layers.

Next, a structure of the common branch wiring 450b and the sub-branch wiring 400c of the display device according to other embodiments will be described with reference to FIGS. 17 to 19.

Figure 17:
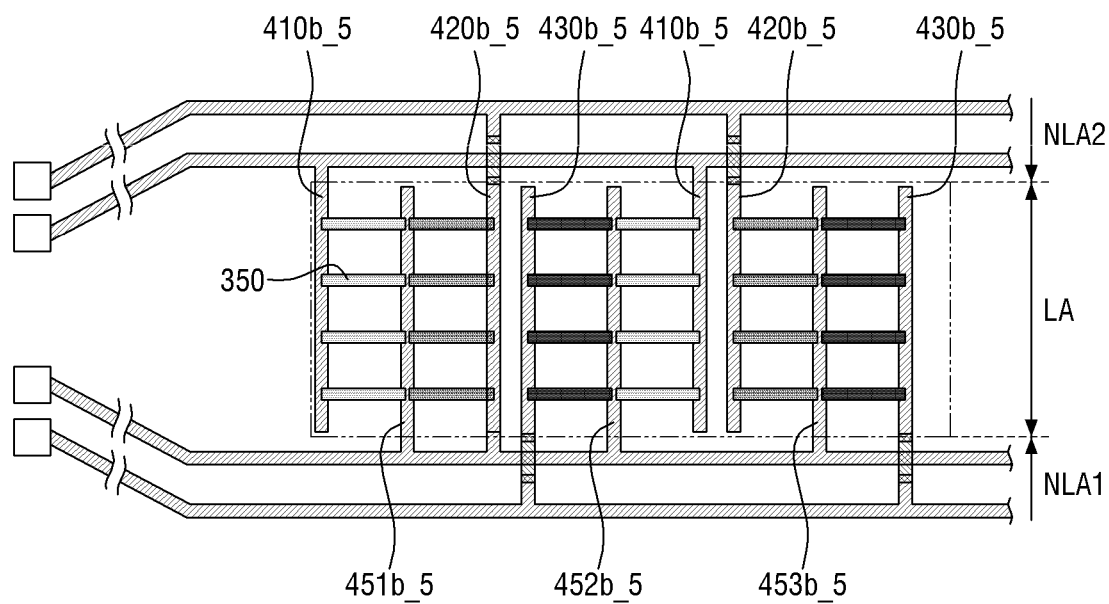
FIG. 17 is a plan view of a display device according to embodiment.

FIG. 17 is a plan view of a display device according to another embodiment.

Referring to FIG. 17, in a display device 10_5, one common branch wiring 450b_5 (e.g., common branch wirings 451b_5, 452b_5, 453b_5) is disposed and shared by two adjacent pixels. For example, one pixel branch wiring in each of two adjacent pixels, for example, a first pixel branch wiring 410b_5 and a second pixel branch wiring 420b_5 are disposed respectively in two adjacent pixels to face each other while being spaced apart from each other, and one common branch wiring 450b_5 may be disposed in a space between the first pixel branch wiring 410b_5 and the second pixel branch wiring 420b_5. Accordingly, the two adjacent pixels PX may share (e.g., may both be exposed to) an electrical signal applied to the common branch wiring 450b_5. However, as described above, because different electrical signals may be applied to the pixel branch wirings 410b, 420b, and 430b to respectively drive them, each pixel PX may display a different color even when the common branch wiring 450b_5 is shared.

The display device 10_5 shown in FIG. 17 may have fewer (e.g., may have a relatively small number of) common branch wirings 450b_5 compared to the display device 10 shown in FIG. 1. For example, in the display device 10 shown in FIG. 1, one common branch wiring 450b is disposed in each of the six pixels PX. On the other hand, in the display device 10_5 shown in FIG. 17, only three common branch wirings 450b_5 are disposed in the six pixels PX. Accordingly, the number of branch wirings disposed in the light emitting portion LA of the display device 10_5 may be reduced, and a plurality of pixels PX may be arranged in a small (or smaller) area, thereby improving the definition or resolution of the display device 10_5.

Figure 18:
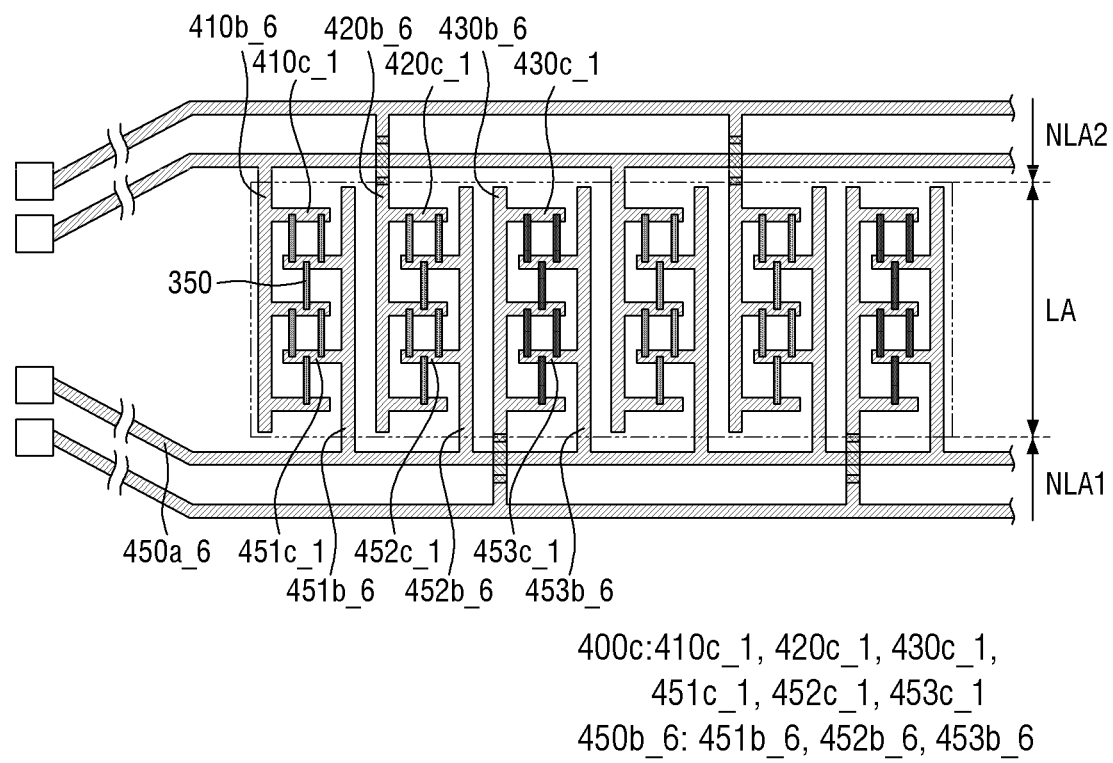
FIGS. 18 and 19 are enlarged views illustrating pixel sub-branch wirings according to embodiments.
Figure 19:
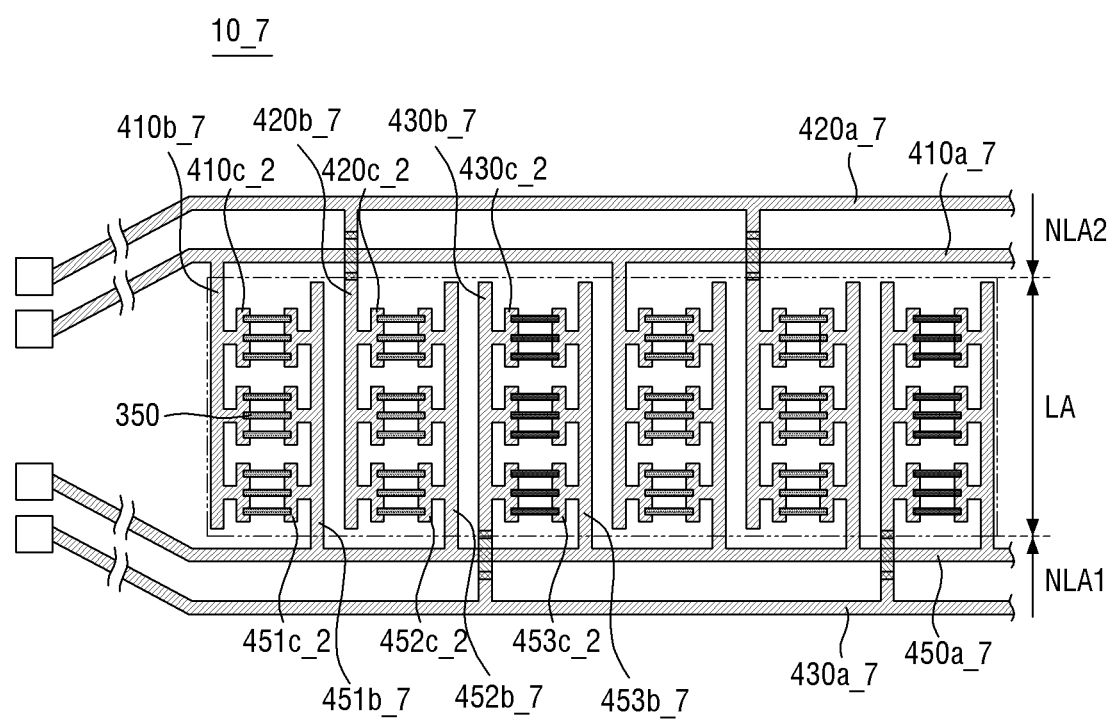

FIGS. 18 and 19 are plan views of display devices according to other embodiments.

As described above, branch wirings of the display device 10 may further include the sub-branch wirings 400c. In display devices 10_6 and 10_7 shown in FIGS. 18 and 19, a plurality of branch wirings further include sub-branch wirings 400c, and the light emitting elements 350 may be arranged between the sub-branch wirings 400c that are disposed spaced apart from each other.

First, referring to FIG. 18, a common branch wiring 450b_6, a first pixel branch wiring 410b_6, a second pixel branch wiring 420b_6, and a third pixel branch wiring 430b_6 may include (e.g., may each include) sub-branch wirings 400c branched from some portions thereof in the first direction.

For example, the first pixel branch wiring 410b_6 and a first common branch wiring 451b_6 disposed in a first pixel may include a first pixel sub-branch wiring 410c_1 and a first common sub-branch wiring 451c_1, respectively, that are branched to face each other in the first direction. The second pixel branch wiring 420b_6 and a second common branch wiring 452b_6 disposed in a second pixel may similarly include a second pixel sub-branch wiring 420c_1 and a second common sub-branch wiring 452c_1, respectively, that are branched to face each other in the first direction. Also a third pixel sub-branch wiring 430c_1 and a third common sub-branch wiring 453c_1 may be included in a third pixel.

Taking the first pixel sub-branch wiring 410c_1 and the first common sub-branch wiring 451c_1 as an example, the first pixel sub-branch wiring 410c_1 and the first common sub-branch wiring 451c_1 are branched in opposite directions and each end is terminated to be spaced apart from the first common branch wiring 451b_6 and the first pixel branch wiring 410b_6. The first pixel sub-branch wiring 410c_1 and the first common sub-branch wiring 451c_1 may have a substantially straight or linear structure (or shape).

In addition, a branch point of the first pixel sub-branch wiring 410c_1 from the first pixel branch wiring 410b_6 and a branch point of the first common sub-branch wiring 451c_1 from the first common branch wiring 451b_6 may be alternately disposed. For example, the first pixel sub-branch wiring 410c_1 and the first common sub-branch wiring 451c_1 may be alternately disposed and spaced apart from each other in a direction parallel to an extending (or extension) direction of the first common branch wiring 451b_6 in the center of the pixel PX.

Accordingly, the light emitting element 350 disposed between the first pixel sub-branch wiring 410c_1 and the first common sub-branch wiring 451c_1 may be disposed parallel to the extending direction of the first common branch wiring 451b_6 and substantially perpendicular to the common stem wiring 450a_6. The second pixel sub-branch wiring 420c_1 and the third pixel sub-branch wiring 430c_1 may have substantially the same arrangement as described above. Therefore, a detailed description thereof will be omitted.

Next, referring to FIG. 19, the structure of sub-branch wirings 400c in a display device 10_7 shown in FIG. 19 is different from that in the display device 10_6 shown in FIG. 18. For example, the arrangement of branch points of the sub-branch wirings 400c from the branch wirings 400b may be different. Except for this, the display device 10_7 shown in FIG. 19 is the same as or substantially similar to the display device 10_6 shown in FIG. 18, and these differences therebetween will be primarily described in more detail below.

First, taking the first pixel sub-branch wiring 410c_2 and the first common sub-branch wiring 451c_2 as an example, the first pixel sub-branch wiring 410c_2 and the first common sub-branch wiring 451c_2 are branched in opposite directions, and each sub-branch wiring may have substantially a "T" shape. For example, the first pixel sub-branch wiring 410c_2 may include a protrusion branched from the first pixel branch wiring 410b_7 and an end surface connected to the protrusion parallel to the first pixel branch wiring 410b_7. Accordingly, different from the first pixel sub-branch wiring 410c_1 shown in FIG. 18, the first pixel sub-branch wiring 410c_2 shown in FIG. 19 may be arranged partially parallel with the first pixel branch wiring 410b_7. The first pixel sub-branch wiring 410c_2 and the first common sub-branch wiring 451c_2 each include the above-described end surface, and the end surfaces are disposed to face each other while being spaced apart from each other.

A branch point of the first pixel sub-branch wiring 410c_2 from the first pixel branch wiring 410b_7 and a branch point of the first common sub-branch wiring 451c_2 from the first common branch wiring 451b_7 may be parallel to each other. For example, the first pixel sub-branch wiring 410c_2 and the first common sub-branch wiring 451c_2 may be substantially horizontally disposed spaced apart from each other in a direction parallel to an extending direction of the first common branch wiring 451b_7 in the center of the pixel PX.

Accordingly, the light emitting element 350 disposed between the end surface of the first pixel sub-branch wiring 410c_2 and the end surface of the first common sub-branch wiring 451c_2 may be disposed perpendicular to the extending direction of the first common branch wiring 451b_7 and substantially parallel to the common stem wiring 450a_7. A second pixel sub-branch wiring 420c_2 and a third pixel sub-branch wiring 430c_2 may have substantially the same arrangement as described above. A detailed description thereof will be omitted.

Next, display devices according to other embodiments will be described with reference to FIGS. 20 to 23. In the display devices 10 according to various embodiments described above, the plurality of branch wirings 410b, 420b, 430b, and 450b are disposed perpendicular to the plurality of stem wirings 410a, 420a, 430a and 450a, and the plurality of branch wirings 410b, 420b, 430b, and 450b has a straight or linear structure. However, the present disclosure is not limited thereto, and the plurality of branch wirings 410b, 420b, 430b, and 450b may have various structures or shapes, such as a curved shape and a zigzag shape. A detailed description of some such examples will be given with reference to FIGS. 20 to 23.

FIGS. 20 to 23 are plan views of display devices according to other embodiments.

Figure 20:
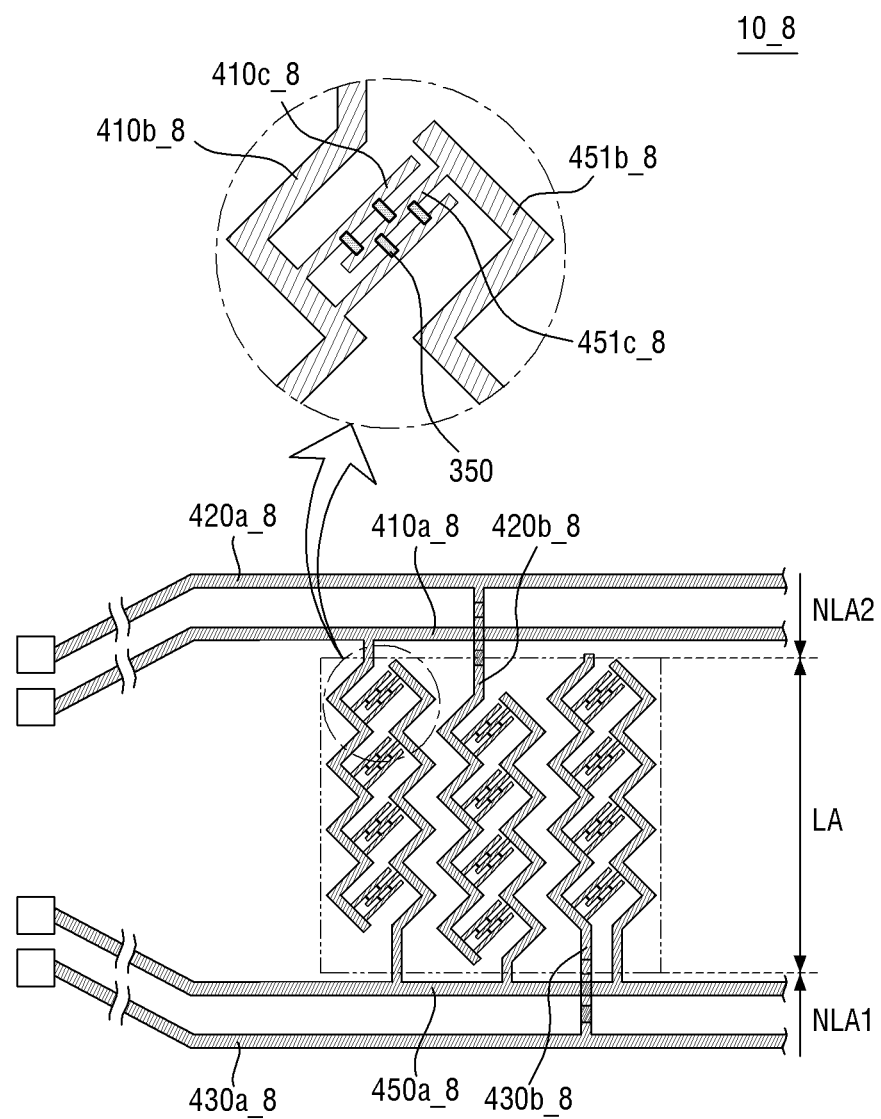
FIGS. 20 to 26 are plan views of display devices according to embodiments.

First, referring to FIG. 20, the pixel branch wirings 410b, 420b, and 430b and the common branch wiring 450b may have a zigzag structure.

Taking a first pixel branch wiring 410b_8 as an example, the first pixel branch wiring 410b_8 is branched in a direction perpendicular to a first pixel stem wiring 410a_8. However, the first pixel branch wiring 410b_8 branched in the perpendicular direction does not extend in the same direction but extends to be inclined with an arbitrary first inclination angle (e.g., inclined with respect to the first pixel branch wiring 410b_8). Then, the first pixel branch wiring 410b_8 extending to be inclined with the first inclination angle further extends to be inclined again with a second inclination angle. For example, the first pixel branch wiring 410b_8 includes a portion inclined outwards and a portion inclined inwards with respect to the center of the pixel PX. The portion inclined outwards and the portion inclined inwards are arranged to be inclined while forming the second inclination angle. In addition, the portion branched in the perpendicular direction from the first pixel stem wiring 410a_8 may form the first inclination angle with the portion inclined outwards.

A first common branch wiring 451b_8 is disposed to face the first pixel branch wiring 410b_8 while being spaced apart therefrom and may be disposed in a symmetrical structure with the first pixel branch wiring 410b_8. As illustrated in FIG. 20, the first common branch wiring 451b_8 includes a portion inclined outwards or a portion inclined inwards with respect to the center of the pixel PX. Accordingly, narrow and wide distances may be repeated between the first pixel branch wiring 410b_8 and the first common branch wiring 451b_8. For example, minimum and maximum perpendicular shortest distances from the first pixel branch wiring 410b_8 to the first common branch wiring 451b_8 are repeated.

The light emitting element 350 may be aligned in an area where the perpendicular shortest distance from the first pixel branch wiring 410b_8 to the first common branch wiring 451b_8 is the maximum (or near the maximum). The first pixel branch wiring 410b_8 and the first common branch wiring 451b_8 include a first pixel sub-branch wiring 410c_8 and a first common sub-branch wiring 451c_8, respectively. The light emitting element 350 may be disposed between the first pixel sub-branch wiring 410c_8 and the first common sub-branch wiring 451c_8 that are spaced apart from each other. The first pixel sub-branch wiring 410c_8 and the first common sub-branch wiring 451c_8 may be branched in a region where the aforementioned perpendicular shortest distance from the first pixel branch wiring 410b_8 to the first common branch wiring 451b_8 is the maximum. Accordingly, an area in which the light emitting elements 350 are aligned in one pixel PX may be partially separated by a region where the perpendicular shortest distance from the first pixel branch wiring 410b_8 to the first common branch wiring 451b_8 is the minimum (or is near the minimum). Accordingly, the area in which the light emitting elements 350 are aligned may have an island-like structure.

Referring to the enlarged view in FIG. 20, the first pixel branch wiring 410b_8 and the first common branch wiring 451b_8 include the first pixel sub-branch wiring 410c_8 and the first common sub-branch wiring 451c_8, respectively. The first pixel sub-branch wiring 410c_8 and the first common sub-branch wiring 451c_8 are branched in opposite directions from the first pixel branch wiring 410b_8 and the first common branch wiring 451b_8, respectively. In addition, each end thereof is terminated to be spaced apart from the first common branch wiring 451b_8 and the first pixel branch wiring 410b_8. In the drawing, two first pixel sub-branch wirings 410c_8 and one first common sub-branch wiring 451c_8 are arranged. However, the present disclosure is not limited thereto, and a greater number of sub-branch wirings may be arranged.

Branch points of the first pixel sub-branch wiring 410c_8 and the first common sub-branch wiring 451c_8 are alternately disposed, and the first pixel sub-branch wiring 410c_8 and the first common sub-branch wiring 451c_8 may have a structure alternately arranged in the center of the pixel PX. The light emitting element 350 may be disposed in a space between the first pixel sub-branch wiring 410c_8 and the first common sub-branch wiring 451c_8.

However, the present disclosure is not limited thereto. In some embodiments, the first pixel sub-branch wiring 410c_8 and the first common sub-branch wiring 451c_8 may be omitted, and the light emitting element 350 may be aligned directly from the first pixel branch wiring 410b_8 to contact the first common branch wiring 451b_8.

The structure described above may also be applied to a pixel branch wiring 420b_8 and a third pixel branch wiring 430b_8, and a detailed description thereof will be omitted.

Figure 21:
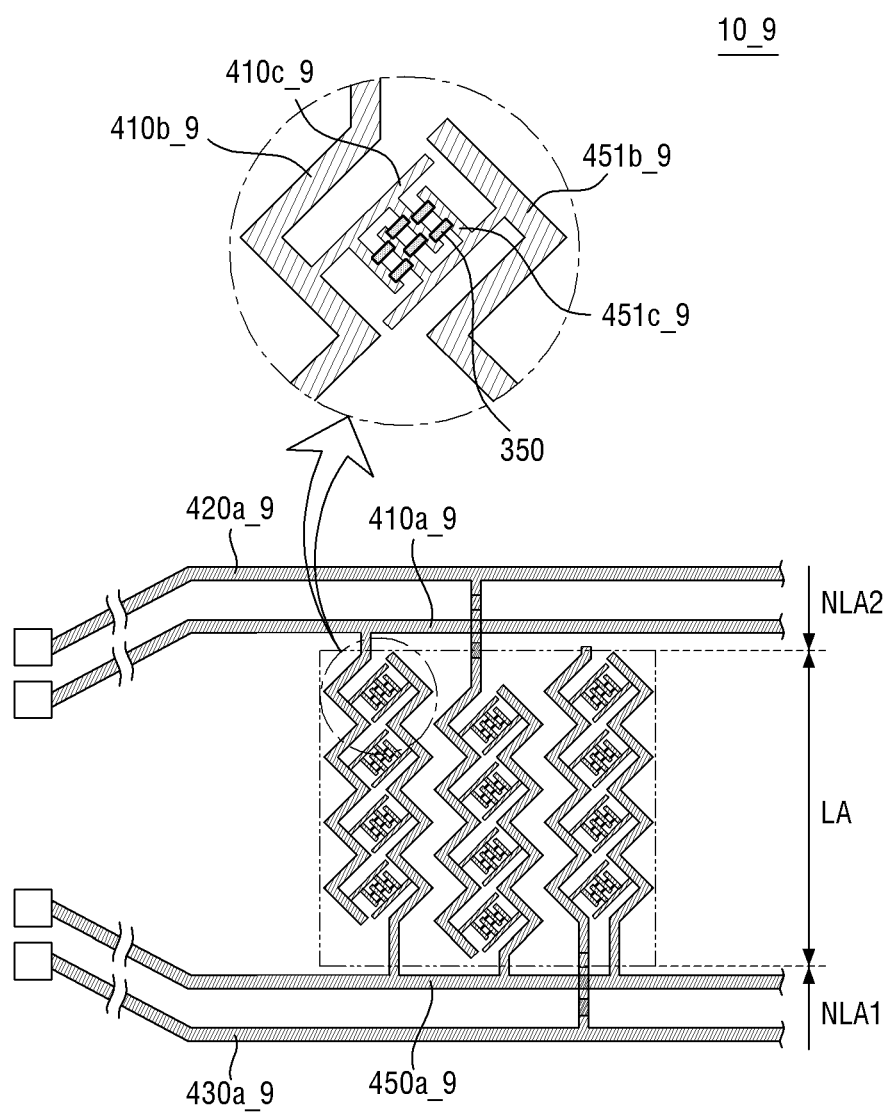
Figure 22:
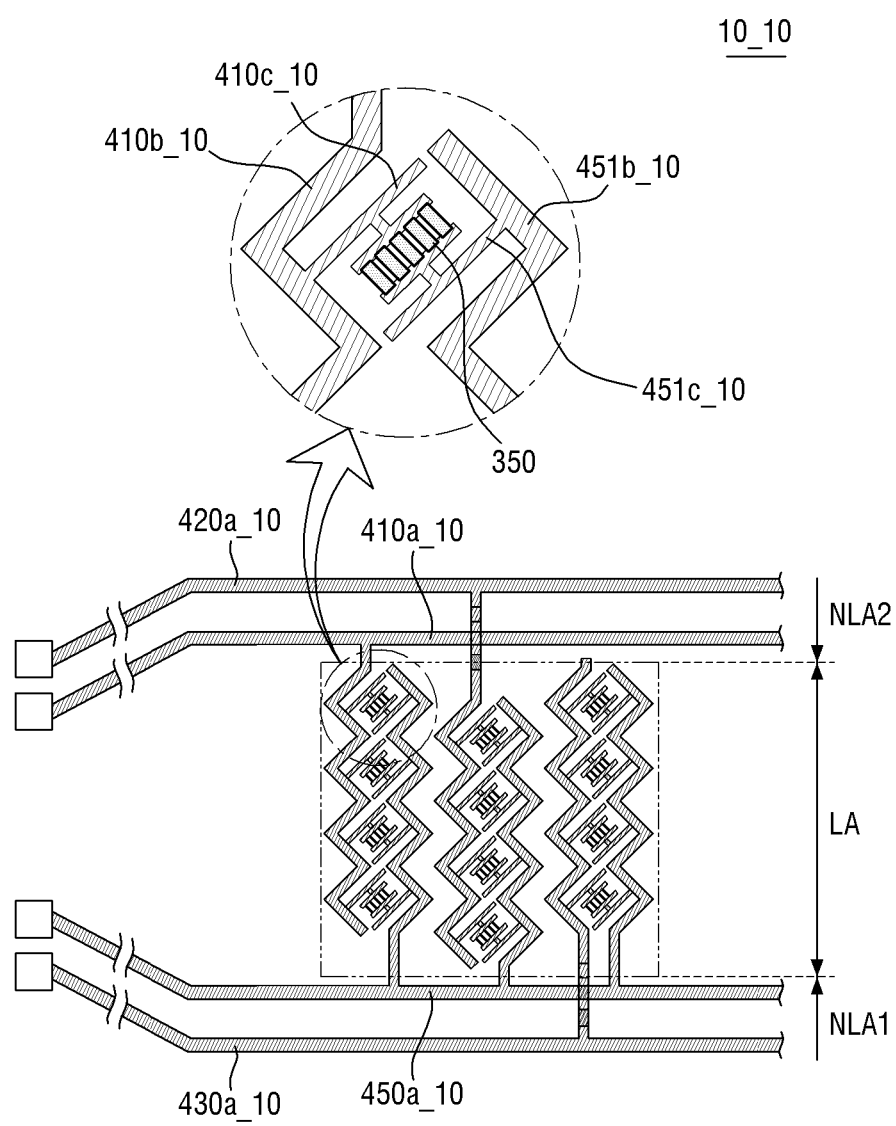

Display devices shown in FIGS. 21 and 22 are the same as or substantially similar to the display device 10_8 shown in FIG. 20 except that the structure of each pixel sub-branch wiring 410c, 420c, 430c, 450c is different. Hereinafter, differences between these embodiments will be primarily described.

Referring to the enlarged view in FIG. 21, a first pixel sub-branch wiring 410c_9 and a first common sub-branch wiring 451c_9 may further include wirings branched in opposite directions. For example, the first pixel sub-branch wiring 410c_9 and the first common sub-branch wiring 451c_9 may be arranged such that some portions thereof are disposed to face each other in parallel and other portions thereof are branched and arranged in opposite directions. The light emitting element 350 may be disposed between the portions branched in the opposite directions of the first pixel sub-branch wiring 410c_9 and the first common sub-branch wiring 451c_9. Accordingly, the light emitting element 350 aligned in the display device 10_8 shown in FIG. 20 and the light emitting element 350 aligned in the display device 10_9 shown in FIG. 21 may be substantially perpendicular to each other.

Next, referring to the enlarged view in FIG. 22, a first pixel sub-branch wiring 410c_10 and a first common sub-branch wiring 451c_10 further include wirings branched in opposite directions. Each branched wiring may have an end surface parallel to the first pixel sub-branch wiring 410c_10 and the first common sub-branch wiring 451c_10. The light emitting element 350 is disposed between the end surfaces parallel to the first pixel sub-branch wiring 410c_10 and the first common sub-branch wiring 451c_10 and may be aligned in substantially similarly to the light emitting element 350 shown in FIG. 20.

Figure 23:
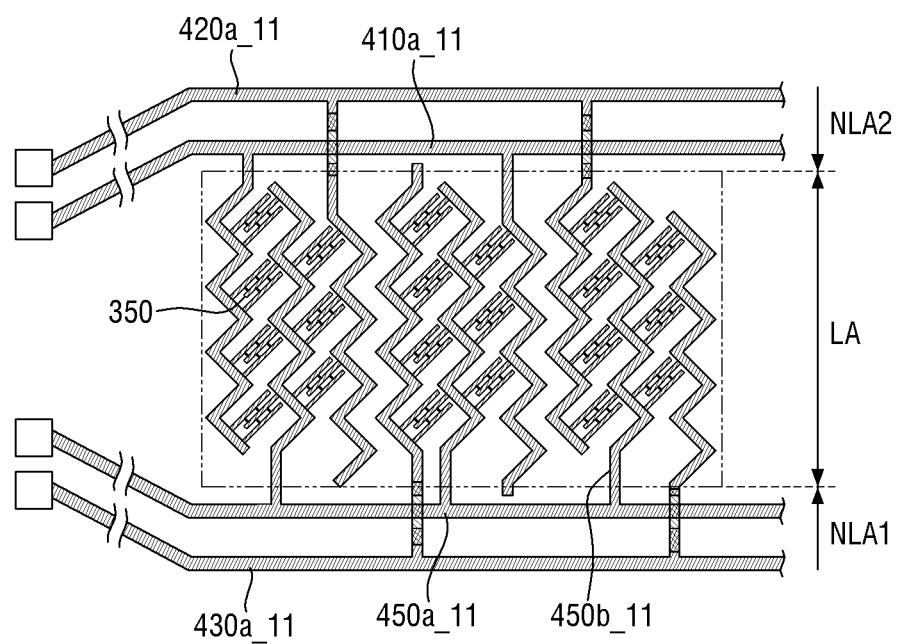

Next, referring to FIG. 23, which shows a display device 10_11 that is similar to the display device 10_5 as described with reference to FIG. 17, in the display device 10_11 shown in FIG. 23, two adjacent pixels PXs may share one common branch wiring 450b_11. In addition, the structure of each branch wiring is the same as described above with reference to FIG. 20. Therefore, a detailed description of the structure will be omitted.

Figure 24:
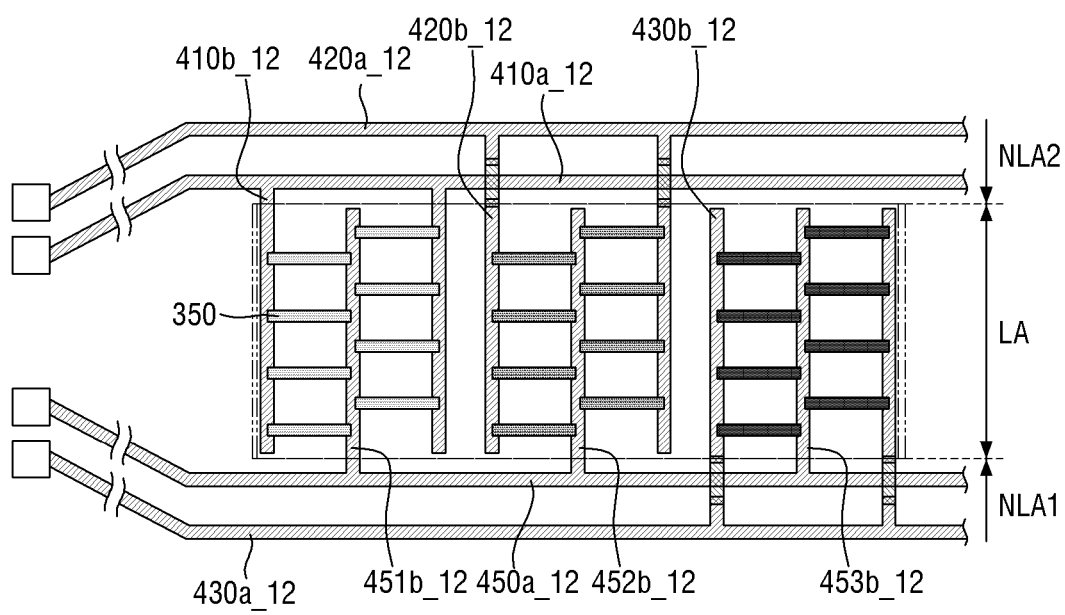

FIG. 24 is a plan view of a display device according to another embodiment. FIG. 24 illustrates three pixels PX in a display device 10_12. One common branch wiring 450b_12 and two pixel branch wirings from among the pixel branch wirings 410b_12, 420b_12, 430b_12 are arranged in each pixel PX. The display device 10_12 shown in FIG. 24 is the same as the display device 10 shown in FIG. 1 except that two pixel branch wirings are arranged in one pixel PX. Differences therebetween will be primarily described in detail below.

Taking a first pixel branch wiring 410b_12 and a first common branch wiring 451b_12 as an example, the first common branch wiring 451b_12 and the first pixel branch wiring 410b_12 are branched from a common stem wiring 450a_12 and a first pixel stem wiring 410a_12, respectively, and extend in a direction toward each pixel PX. Two first pixel branch wirings 410b_12 are disposed spaced apart from each other in one pixel PX. The two first pixel branch wirings 410b_12 are disposed to face each other while being spaced apart from each other in the pixel PX. The first common branch wiring 451b_12 is disposed between the first pixel branch wirings 410b_12, which are spaced apart from each other. For example, the first pixel branch wiring 410b_12 and the first common branch wiring 451b_12 are alternately arranged in the first direction in which the common stem wiring 450a_12 extends in the center of the pixel PX. Because two first pixel branch wirings 410b_12 may be disposed in one pixel PX, the number of light emitting elements 350 disposed between the first common branch wiring 451b_12 and the first pixel branch wirings 410b_12 may greater than that of the display device 10 shown in FIG. 1.

The same is true for a second pixel branch wiring 420b_12 and a second common branch wiring 452b_12. However, because a third pixel stem wiring 430a_12 and the common stem wiring 450a_12 are disposed in a first non-light emitting portion NLA1, which is a non-display portion, a third pixel branch wiring 430b_12 and a third common branch wiring 453b_12 may be disposed substantially parallel to each other within the pixel PX. For example, each end of the third pixel branch wiring 430b_12 and the third common branch wiring 453b_12 may be disposed in the same direction.

As described above, in the pixel wirings 410, 420, and 430 of the display device 10, the pixel stem wirings 410a, 420a, and 430a or the pixel branch wirings 410b, 420b, and 430b may be partially divided. Each of the divided wirings may constitute one pixel PX. The same electrical signal may be applied through the common wiring 450, but different electrical signals may be applied to the pixel wirings 410, 420, and 430 so that each pixel PX may be driven separately. A more detailed description thereof will be given with reference to FIGS. 25 and 26.

Figure 25:
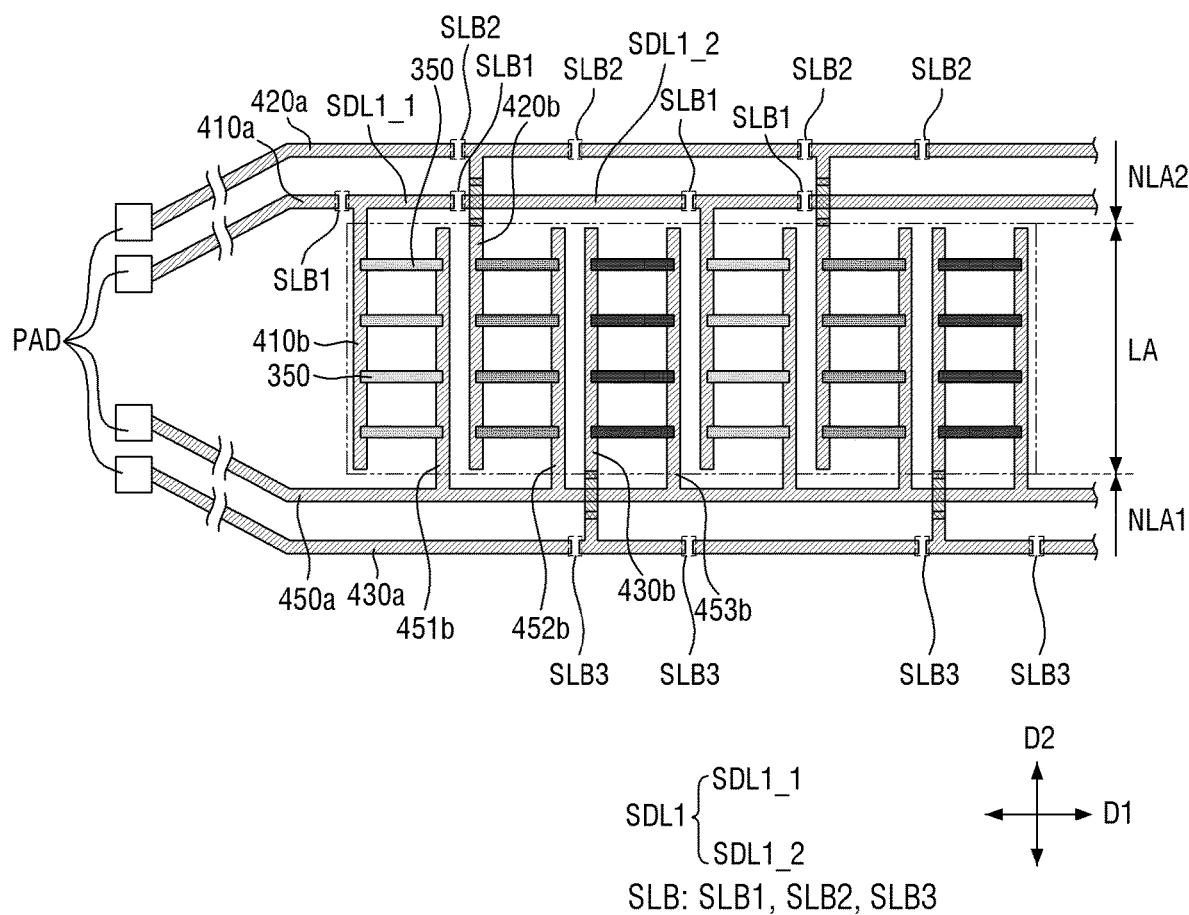
Figure 26:
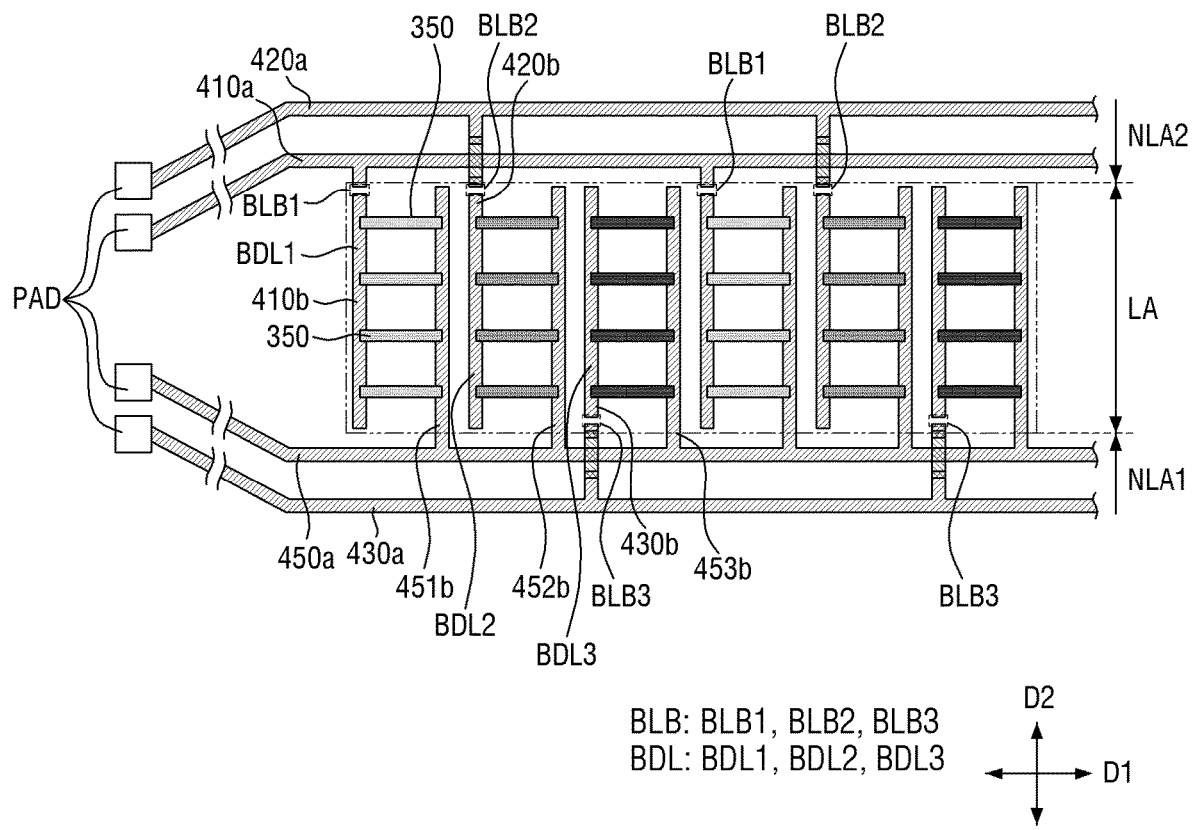

FIGS. 25 and 26 are plan views of display devices according to still other embodiments.

First, referring to FIG. 25, each pixel stem wiring 410a, 420a, 430a of a display device 10_13 may have at least one stem separation portion SLB (e.g., SLB1, SLB2, SLB3) spaced apart from each other and at least one stem separation wiring SDL.

Taking a first pixel stem wiring 410a as an example, the first pixel stem wiring 410a may have a plurality of first stem separation portions SLB1 which creates an electrical disconnect, and a plurality of first stem separation wirings SDL1 divided and disposed between the plurality of first stem separation portions SLB1. The first stem separation wiring SDL1 and the first stem separation portion SLB1 may be aligned along a first direction D1 in which the first pixel stem wiring 410a extends.

The first pixel stem wiring 410a may be divided by the plurality of first stem separation portions SLB1, and different electrical signals may be applied to the plurality of first stem separation wirings SDL1. The plurality of first stem separation wirings SDL1 may receive different electrical signals through different thin film transistors. Accordingly, a first pixel PX1 is electrically separated from a fourth pixel PX4 having the same first pixel branch wiring 410b and may be separately driven even when a light emitting element 350 emitting the same color is disposed therein.

In an embodiment, the first pixel stem wiring 410a may be separated at a region overlapping the boundary of the first pixel PX1. For example, the plurality of first stem separation portions SLB1 may be at least one of the regions where the extension in the second direction D2 of both side boundaries of the first pixel PX1 overlap the first pixel stem wiring 410a.

FIG. 25 illustrates an embodiment in which the first pixel stem wiring 410a is separated at both side boundaries of the first pixel PX1. In this embodiment, the first stem separation wiring SDL1 may include a first separated wiring SDL1_1 through which an electrical signal may be applied to the first pixel PX1 and a second separated wiring SDL1_2 through which an electrical signal is not applied. The first separated wiring SDL1_1 may be disposed in an extending area in the second direction of the first pixel PX1. The second separated wiring SDL1_2 may be disposed in an extending area in the second direction D2 of other pixels than the first pixel PX1. Accordingly, the distances between the plurality of first stem separation portions SLB1 may be different. In addition, the length of the first separated wiring SDL1_1 in the first direction may be substantially the same as the length of the first pixel PX1 in the first direction.

However, the present disclosure is not limited thereto. The structure or arrangement of the first stem separation wiring SDL1 may be variously modified depending on the first stem separation portion SLB1 that may be formed in one pixel PX. For example, when the first pixel stem wiring 410a is separated at one side boundary of the first pixel PX1, the distances between the plurality of first stem separation portions SLB1 and the lengths of the plurality of first stem separation wirings SDL1 may be the same. Accordingly, the plurality of first stem separation wirings SDL1 may include only the first separated wiring SDL1_1 through which an electrical signal may be applied to the first pixel PX1.

The plurality of first stem separation portions SLB1 may be disposed in an area overlapping a boundary between the first pixel PX1 and an adjacent pixel thereof, but the present disclosure is not limited thereto. In some embodiments, the plurality of first stem separation portions SLB1 may be disposed outside the boundary with the adjacent pixel. In this embodiment, the first pixel PX1 may be substantially included in an arbitrary region formed by extending the plurality of first stem separation portions SLB1 in the second direction. The plurality of first stem separation portions SLB1 may be disposed inside the boundary with the adjacent pixel. In this embodiment, the arbitrary region formed by extending the plurality of first stem separation portions SLB1 in the second direction may be substantially included in the first pixel PX1.

In addition, because another pixel (e.g., the second pixel PX2) adjacent to the first pixel PX1 receives an electrical signal from a second pixel stem wiring 420a, which is a separate pixel wiring, the first stem separation portion SLB1 may not necessarily be disposed in a region adjacent to the boundary of the first pixel PX1. For example, the first stem separation portion SLB1 may be disposed in a region overlapping the second pixel PX2 or a third pixel PX3.

The first pixel PX1 and the first pixel stem wiring 410a have been exemplarily described above, but the same or substantially similar structures, shapes, etc. is true for the second pixel PX2 and the second pixel stem wiring 420a and the third pixel PX3 and the third pixel stem wiring 430a. Therefore, a description thereof will be omitted.

Next, referring to FIG. 26, a pixel branch wiring 410b, 420b, 430b disposed in each pixel PX of a display device 10_14 may have at least one branch separation portion BLB (e.g., BLB1, BLB2, BLB3) and at least one branch separation wiring BDL (e.g., BDL1, BDL2, BDL3).

Taking a first pixel branch wiring 410b as an example, the first pixel branch wiring 410b may have a plurality of first branch separation portions BLB1 at where electric disconnections occur, and a plurality of first branch separation wirings BDL1 divided by and disposed between the plurality of first branch separation portions BLB1. The first branch separation wiring BDL1 and the first branch separation portion BLB1 may be aligned along a second direction D2 in which the first pixel branch wiring 410b extends.

The first pixel branch wiring 410b may be divided by the plurality of first branch separation portions BLB1, and different electrical signals may be applied to the plurality of first branch separation wirings BDL1. Accordingly, a first pixel PX1 may be electrically separated from a fourth pixel PX4 having the same first pixel branch wiring 410b and may be separately driven even when the light emitting element 350 emitting the same color is disposed.

Further, the first pixel branch wiring 410b in the first pixel PX1 may be divided into the plurality of first branch separation wirings BDL1 so that the first pixel PX1 may be divided into separate pixels PX. Accordingly, the plurality of first branch separation wirings BDL1 each may constitute the pixel electrode 330 of the pixel PX. However, the present disclosure is not limited thereto.

The first pixel branch wiring 410b has been exemplarily described above. However, a second pixel PX2 and a second pixel branch wiring 420b may also have a second branch separation portion BLB2 and a second branch separation wiring BDL2, and a third pixel PX3 and a third pixel branch wiring 430b may also have a third branch separation portion BLB3 and a third branch separation wiring BDL3. Therefore, a repeated description thereof will be omitted.

Those skilled in the art will appreciate that many variations and modifications can be made to the example embodiments described herein without departing from the spirit and scope of the present disclosure. Therefore, the disclosed example embodiments of the present disclosure are used in a generic and descriptive sense and not for purposes of limitation.

The invention claimed is:

1. A display device comprising:
a first pixel stem wiring and a common stem wiring extending in a first direction and spaced apart from each other;
a first pixel branch wiring branched from the first pixel stem wiring and extending in a second direction crossing the first direction, the first pixel branch wiring comprising a base branch pattern connected to the first pixel stem wiring, a separate branch pattern spaced apart from the base branch pattern, and a bridge wiring connecting the base branch pattern to the separate branch pattern;
a common branch wiring branched from the common stem wiring and extending in the second direction;
a first light emitting element between the first pixel branch wiring and the common branch wiring;
a second pixel stem wiring extending in the first direction and spaced apart from the first pixel stem wiring and the common stem wiring;
a second pixel branch wiring branched from the second pixel stem wiring and extending in the second direction; and
a second light emitting element between the second pixel branch wiring and the common branch wiring,
wherein the first pixel stem wiring, the base branch pattern, and the separate branch pattern are in a first conductive layer,
wherein the bridge wiring is in a second conductive layer on a different layer than the first conductive layer, and
wherein the first light emitting elements are between the common branch wiring and the separate branch pattern.

2. The display device of claim 1, wherein the common branch wiring extends in one direction of the second direction, and
wherein the first pixel branch wiring extends in an opposite direction of the one direction of the second direction.

3. The display device of claim 2, wherein a distal end of the first pixel branch wiring is spaced apart from the common stem wiring, and
wherein the separate branch pattern of the first pixel branch wiring is spaced apart from the common stem wiring.

4. The display device of claim 1, wherein the bridge wiring crosses the second pixel stem wiring or the common stem wiring.

5. The display device of claim 4, wherein the second pixel stem wiring, the second pixel branch wiring, and the common stem wiring are in the first conductive layer.

6. The display device of claim 5, wherein the bridge wiring crosses the common stem wiring,
wherein the common branch wiring extends in one direction of the second direction, and
wherein the second pixel branch wiring extends in the one direction of the second direction.

7. The display device of claim 1, further comprising:
a third pixel stem wiring extending in the first direction and spaced apart from the first pixel stem wiring;
a third pixel branch wiring branched from the third pixel stem wiring and extending in the second direction, the third pixel branch wiring comprising a third base branch pattern connected to the third pixel stem wiring, a separate third branch pattern spaced apart from the third base branch pattern, and a third bridge wiring connecting the third base branch pattern to the separate third branch pattern; and
a third light emitting element between the third pixel branch wiring and the common branch wiring.

8. The display device of claim 7, wherein the bridge wiring crosses the second pixel stem wiring or the common stem wiring.

9. The display device of claim 8, wherein the third pixel stem wiring and the first pixel stem wiring are in the first conductive layer, and
wherein the bridge wiring and the third bridge wiring are in the second conductive layer.

10. A display device comprising:
a pixel stem wiring and a common stem wiring extending in a first direction and spaced apart from each other, the pixel stem wiring comprising a first pixel stem wiring, a second pixel stem wiring, and a third pixel stem wiring;
a pixel branch wiring branched from the pixel stem wiring and extending in a second direction crossing the first direction, the pixel branch wiring comprising a base branch pattern connected to the pixel stem wiring, a separate branch pattern spaced apart from the base branch pattern, and a bridge wiring connecting the base branch pattern to the separate branch pattern;
a common branch wiring branched from the common stem wiring and extending in the second direction; and a light emitting element between the pixel branch wiring and the common branch wiring, wherein the pixel branch wiring comprises a first pixel branch wiring branched in the second direction from the first pixel stem wiring, wherein the pixel branch wiring further comprises a second pixel branch wiring branched in the second direction from the second pixel stem wiring, and wherein the pixel branch wiring further comprises a third pixel branch wiring branched in the second direction from the third pixel stem wiring.

11. The display device of claim 10, wherein the common branch wiring comprises:
- a first common branch wiring spaced apart from and facing the first pixel branch wiring;
- a second common branch wiring spaced apart from and facing the second pixel branch wiring; and
- a third common branch wiring spaced apart from and facing the third pixel branch wiring.

12. The display device of claim 11, wherein the display device has a light emitting portion in which the light emitting element is arranged and a non-light emitting portion other than the light emitting portion, wherein the first pixel stem wiring, the second pixel stem wiring, the third pixel stem wiring, and the common stem wiring are in the non-light emitting portion, and wherein the first pixel branch wiring, the second pixel branch wiring, the third pixel branch wiring, and the common branch wiring are in the light emitting portion.

13. The display device of claim 12, wherein the non-light emitting portion has a first non-light emitting portion at a first side of the light emitting portion and a second non-light emitting portion at a second side of the light emitting portion, and wherein the first pixel stem wiring, the second pixel stem wiring, the third pixel stem wiring, or the common stem wiring is in the first non-light emitting portion.

14. The display device of claim 13, wherein the first pixel stem wiring and the second pixel stem wiring are spaced apart from each other in the first non-light emitting portion, wherein the third pixel stem wiring and the common stem wiring are spaced apart from each other in the second non-light emitting portion, and wherein a shortest distance to the first pixel stem wiring and the common stem wiring from the light emitting portion is smaller than a shortest distance to the second pixel stem wiring and the third pixel stem wiring from the light emitting portion.

15. The display device of claim 14, further comprising:
- a first wiring layer comprising the pixel stem wiring, the base branch pattern, and the separate branch pattern;
- an insulating film layer having a first contact opening exposing the base branch pattern and a second contact opening exposing the separate branch pattern; and
- a second wiring layer comprising the bridge wiring that electrically connects the base branch pattern to the separate branch pattern through the first contact opening and the second contact opening in the insulating film layer, wherein the bridge wiring is in electrical contact with the pixel stem wiring.

16. The display device of claim 15, wherein the first pixel stem wiring, the second pixel stem wiring, and the third pixel stem wiring is in the second wiring layer and is in electrical contact with the bridge wiring.

17. The display device of claim 10, wherein the pixel stem wiring comprises a stem separation wiring having regions that are electrically disconnected from each other, and wherein adjacent regions of the stem separation wiring are arranged in the first direction and are electrically connected to the pixel branch wiring.

18. The display device of claim 17, wherein the first pixel branch wiring, the second pixel branch wiring, and the third pixel branch wiring comprise a branch separation wiring having regions that are electrically disconnected from each other, and wherein the regions of the branch separation wiring are arranged in the same direction as an extending direction of the first pixel branch wiring, the second pixel branch wiring, and the third pixel branch wiring.

* * * * *